(12) United States Patent
Ausserlechner et al.

(10) Patent No.: US 9,312,472 B2
(45) Date of Patent: Apr. 12, 2016

(54) VERTICAL HALL DEVICE WITH ELECTRICAL 180 DEGREE SYMMETRY

(75) Inventors: Udo Ausserlechner, Villach (AT); Mario Motz, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 498 days.

(21) Appl. No.: 13/400,214

(22) Filed: Feb. 20, 2012

(65) Prior Publication Data
US 2013/0214775 A1 Aug. 22, 2013

(51) Int. Cl.
*H01L 43/06* (2006.01)
*G01R 33/07* (2006.01)

(52) U.S. Cl.
CPC ............ *H01L 43/065* (2013.01); *G01R 33/077* (2013.01)

(58) Field of Classification Search
CPC ....................................... G01R 33/06
See application file for complete search history.

(56) References Cited

U.S. PATENT DOCUMENTS

| | | | |
|---|---|---|---|
| 3,823,354 A | 7/1974 | Janssen | |
| 4,141,026 A | 2/1979 | Bate et al. | |
| 4,667,391 A | 5/1987 | Chapuy et al. | |
| 4,829,352 A | 5/1989 | Popovic et al. | |
| 5,572,058 A | 11/1996 | Biard | |
| 5,880,586 A | 3/1999 | Dukart et al. | |
| 6,008,643 A | 12/1999 | Mani et al. | |
| 6,542,068 B1 | 4/2003 | Drapp et al. | |
| 6,590,389 B1 | 7/2003 | Shibasaki et al. | |
| 6,768,301 B1 * | 7/2004 | Hohe et al. | 324/251 |
| 7,511,484 B2 * | 3/2009 | Oohira et al. | 324/251 |
| 7,782,050 B2 * | 8/2010 | Ausserlechner et al. | 324/251 |
| 7,872,322 B2 * | 1/2011 | Schott et al. | 257/427 |
| 8,164,149 B2 * | 4/2012 | Schott | 257/427 |
| 2006/0011999 A1 | 1/2006 | Schott et al. | |
| 2007/0029999 A1 | 2/2007 | Middelhoek et al. | |
| 2009/0121707 A1 | 5/2009 | Schott | |

(Continued)

FOREIGN PATENT DOCUMENTS

| DE | 10150950 C1 | 6/2003 |
|---|---|---|
| DE | 102011101604 A1 | 12/2011 |

(Continued)

OTHER PUBLICATIONS

R.S. Popovic, "Hall Devices for Magnetic Sensor Microsystems", IEEE 1997 International Conference on Solid-State Sensors and Actuators, Chicago, Jun. 16-19, 1997, p. 377-380.

(Continued)

*Primary Examiner* — Tung X Nguyen
*Assistant Examiner* — Feba Pothen
(74) *Attorney, Agent, or Firm* — Eschweiler & Associates, LLC

(57) ABSTRACT

A vertical Hall device indicative of a magnetic field parallel to a surface of a substrate comprises first, second, third and fourth terminals. The vertical Hall device further comprises contacts to generate a Hall effect signal indicative of the magnetic field. At least one pair of Hall effect regions is provided which comprises a first Hall effect region and a second Hall effect region formed in the substrate. A first group of the contacts is arranged in or at a surface of the first Hall effect region, the first group comprising a first and second outmost contacts. A second group of contacts is arranged in or at a surface of the second Hall effect region, the second group comprising third and fourth outmost contacts. Each of the first, second, third and fourth terminals is connected to a same number of outmost contacts.

26 Claims, 21 Drawing Sheets

Clock phase 1: cross-section

(56) References Cited

U.S. PATENT DOCUMENTS

| | | |
|---|---|---|
| 2009/0256559 A1 | 10/2009 | Ausserlechner et al. |
| 2010/0019331 A1* | 1/2010 | Kilian .......................... 257/421 |
| 2010/0123458 A1 | 5/2010 | Schott |
| 2010/0133632 A1* | 6/2010 | Schott .......................... 257/427 |
| 2010/0164491 A1 | 7/2010 | Kejik et al. |
| 2013/0015853 A1 | 1/2013 | Raz et al. |
| 2013/0021026 A1 | 1/2013 | Ausserlechner |
| 2013/0021027 A1* | 1/2013 | Ausserlechner ............. 324/251 |

FOREIGN PATENT DOCUMENTS

| | | |
|---|---|---|
| EP | 0503141 A1 | 9/1992 |
| EP | 0704710 A1 | 4/1996 |
| EP | 0947846 A2 | 10/1999 |
| EP | 1436849 A2 | 7/2004 |
| EP | 1438755 A2 | 7/2004 |
| JP | 58154263 A | 9/1983 |
| JP | S6327075 A | 2/1988 |
| WO | 03036732 A2 | 5/2003 |
| WO | 03036733 A2 | 5/2003 |
| WO | 2004025742 A1 | 3/2004 |
| WO | 2006074989 A2 | 7/2006 |
| WO | 2008145662 A1 | 12/2008 |

OTHER PUBLICATIONS

Ch. Schott, et al., "Linearizing Integrated Hall Devices", IEEE 1997 International Conference on Solid-State Sensors and Actuators, Chicago, Jun. 16-19, 1997, p. 393-396.
Popovic, R.S. "Hall Devices for Magnetic Sensor Microsystems." Swiss Federal Institute of Technology at Lausanne, EPFL-DMT-IMS, Lausanne, Switzerland. 4 Pages.
U.S. Appl. No. 13/187,935 filed on Jul. 21, 2011. 72 Pages.
U.S. Appl. No. 13/187,970 filed on Jul. 21, 2011. 67 Pages.
Office Action dated Jun. 25, 2014 U.S. Appl. No. 13/187,970.
Office Action Dated May 14, 2014 U.S. Appl. No. 13/187,935.
Notice of Allowance Dated Nov. 21, 2014 U.S. Appl. No. 13/187,970.
U.S. Appl. No. 14/611,367 filed on Feb. 2, 2015.
Notice of Allowance Dated Dec. 15, 2014 U.S. Appl. No. 13/187,935.
Non Final Office Action Dated Oct. 1, 2015 U.S. Appl. No. 14/672,757.
U.S. Appl. No. 14/672,757, filed on Mar. 30, 2015.

* cited by examiner

Clock phase 1: cross-section

Clock phase 2: cross-section plan view of column arrangement:

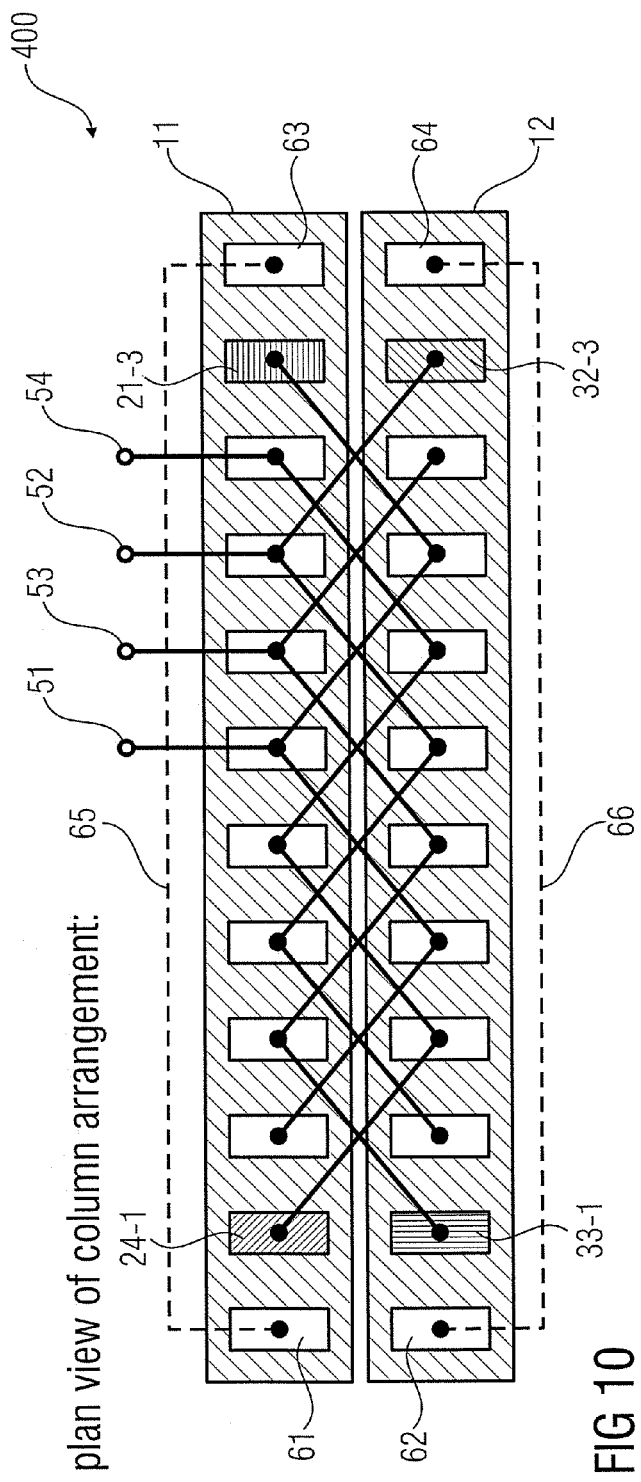

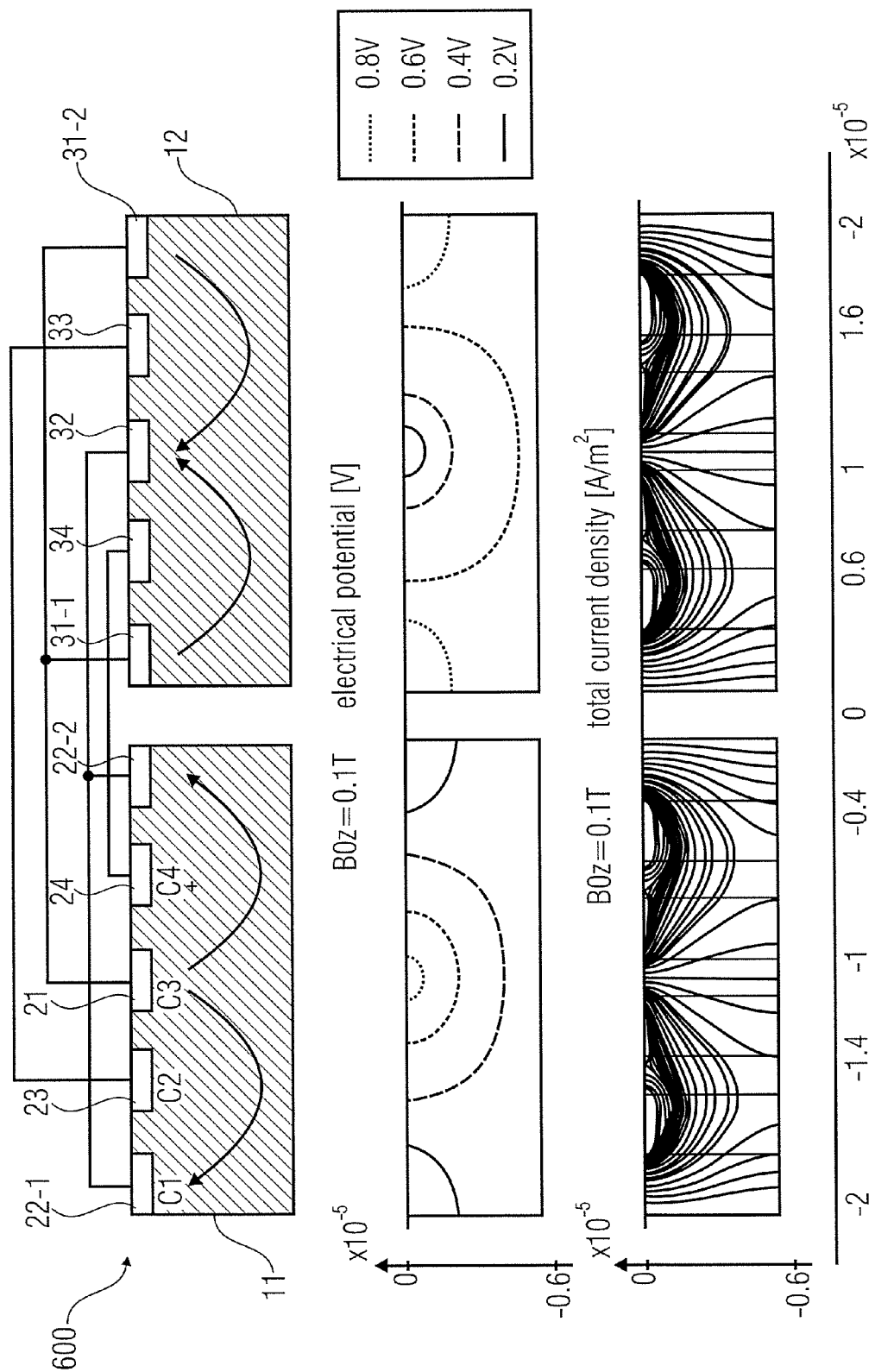

VERTICAL HALL DEVICE WITH ELECTRICAL 180 DEGREE SYMMETRY

FIELD

Embodiments of the present invention relate to a vertical Hall device and to a sensing method employing such a vertical Hall device.

BACKGROUND

Vertical Hall devices may be used to sense or measure physical quantities. In order to sense or measure the strength and/or the direction of a magnetic field parallel to the surface of, e.g., a semiconductor die, vertical Hall devices may be used. Most vertical Hall devices suffer from the fact that the spinning current method, which is used to cancel the zero-point error of the vertical Hall device, does not work very well. With known methods of the spinning current scheme it is possible to obtain residual point errors of about 1 mT. A reason for this rather poor offset behavior can be found in the asymmetry of the vertical Hall device. This residual zero-point error of vertical Hall sensors which respond to magnetic field components parallel to the substrate is common to most vertical Hall devices. The zero-point error is also referred to as offset error.

The offset error (or offset) is the output signal in the absence of the magnetic field which the sensor should detect. The origin of the offset error is basically an asymmetry of the device. This asymmetry can be caused by asymmetry in the geometrical shape (which of course one tries to avoid). Yet, even in the case of near-perfect geometrical asymmetry, the potential distribution in the device causes an asymmetry, due to the junction-field-effect. The junction-field-effect owes its name from an analogy to the working principle of the junction-field-effect transistor (JFET). According to this technique, an active volume within the substrate is confined by a reverse biased pn-junction forming an isolating depletion layer. However, the thickness of this layer is voltage dependent. During operation, Hall voltage and magneto-resistance effect lead to potential variation inside the device and the active volume is deformed causing some kind of junction-field-effect non-linearity.

SUMMARY

Embodiments of the present invention provide a vertical Hall device indicative of a magnetic field parallel to a surface of a substrate. The vertical Hall device comprises first, second, third and fourth terminals. The vertical Hall device also comprises contacts to generate a Hall effect signal indicative of the magnetic field and at least one pair of Hall effect regions, the at least one pair of Hall effect regions comprising a first Hall effect region and a second Hall effect region formed in the substrate. The vertical Hall device further comprises a first group of the contacts being arranged in or at a surface of the first Hall effect region, the first group comprising first and second outmost contacts. The vertical Hall device further comprises a second group of contacts arranged in or at a surface of the second Hall effect region, the second group comprising third and fourth outmost contacts. Each of the first, second, third and fourth terminals is connected to a same number of outmost contacts.

Further embodiments of the present invention relate to a vertical Hall device indicative of a magnetic field parallel to the surface of a substrate. The vertical Hall device comprises at least one pair of Hall effect regions, the at least one pair of Hall effect regions comprising a first Hall effect region and a second Hall effect region, a first group of contacts associated with the first Hall effect region, and a second group of contacts associated with the second Hall effect region. The vertical Hall device is configured to utilize during a first spinning phase a first subset of contacts from the first group of contacts as supply contacts for the first Hall effect region and a second subset of contacts from the second group of contacts as supply contacts for the second Hall effect region. The number of contacts in the first subset of contacts is equal to the number of contacts in the second subset of contacts. Trajectories of current streamlines generated by the first subset of contacts in the first Hall effect region are opposite-identical to trajectories of current streamlines generated by the second subset of contacts in the second Hall effect region. The vertical Hall device is further configured to utilize during a second spinning phase a third subset of contacts from the first group of contacts as supply contacts for the first Hall effect region, the third subset including contacts of the first group which are not contained in the first subset, and a fourth subset of contacts from the second group of contacts as supply contacts for the second Hall effect region. The contacts of the fourth subset of contacts include contacts of the second group of contacts which are not contained in the second subset. Trajectories of the current streamlines generated by the third subgroup of contacts in the first Hall effect region are opposite-identical to trajectories of the current streamlines generated by the fourth subgroup of contacts in the second Hall effect region.

Further embodiments provide a vertical Hall device, the vertical Hall device comprising a first group of contacts associated with a first Hall effect region and a second group of contacts associated with a second Hall effect region. During a first spinning phase, a first subset of the first group of contacts is used to generate first electrical currents and a second subset of the second group of contacts is used to generate second electrical currents, such that each current streamline generated by the first subset has a counterpart with opposite direction generated by the second subset. During a second spinning phase, a third subset of the first group of contacts is used to generate third electrical currents and a fourth subset of the second group of contacts is used to generate fourth electrical currents, such that each current streamline generated by the third subset has a counterpart with opposite direction generated by the fourth subset. The third subset is complementary to the first subset and the fourth subset is complementary to the second subset.

Further embodiments provide a vertical Hall device comprising a first Hall effect region and a second Hall effect region. A first sequence of n contacts is associated with the first Hall effect region, the first sequence of contacts having contacts in an order from 1 to n, wherein n is an integer number greater or equal to 4. A second sequence of n contacts is associated with the second Hall effect region, the second sequence having an order of contacts from 1 to n. For each m being an integer between 1 and n−2, the m-th contact of the first sequence of contacts is connected to the (m+2)th contact of the corresponding contact in the second sequence, and the (m+2)th contact of the first sequence is connected to the m-th contact of the second sequence.

According to further embodiments a vertical Hall sensor comprises a first sequence of contacts associated with a first Hall effect region and a second sequence of contacts associated with a second Hall effect region. The vertical Hall sensor is operable during a first spinning phase to induce or cause one or more electrical currents in the first Hall effect region and the second Hall effect region. For each current streamline in the first Hall effect region exists a corresponding current streamline in the second Hall effect region with reverse flow direction. The vertical Hall sensor is operable during a second spinning phase to induce or cause one or more electrical currents in the first Hall effect region and the second Hall effect region. For each current streamline in the first Hall effect region exists a corresponding current streamline in the second Hall effect region with reverse flow direction. Contacts of the first sequences are swapped when generating the electrical currents in the first spinning phase and the second spinning phase and contacts of the second sequence are swapped when generating the electrical currents in the first spinning phase and the second spinning phase.

Further embodiments provide a sensing method for sensing a magnetic field parallel to a surface of a substrate. The method comprises applying an electrical supply to a pair of Hall effect regions comprising a first Hall effect region and a second Hall effect region formed in the substrate. A first group of contacts is arranged in or at a surface of the first Hall effect region and a second group of contacts is arranged in or at a surface of the second Hall effect region. Applying the electrical supply occurs via a first terminal and a second terminal. The first and second terminals are connected to a same number of outmost contacts of the first group of contacts or the second group of contacts. The method further comprises sensing a sense signal between a third terminal and a fourth terminal. The third terminal is connected to contacts of the first group other than the outmost contacts. The fourth terminal is connected to contacts of the second group other than the outmost contacts. Each of the third terminal and the fourth terminal is connected to the same number of outmost contacts of the first group or the second group of contacts as the first terminal and the second terminal. The method also comprises an action of applying the electrical supply to the pair of Hall effect regions via the third terminal and the fourth terminal. Furthermore, the method comprises sensing a further sense signal between the first terminal and the second terminal. The method also comprises determining an output signal indicative of the magnetic field on the basis of the sense signal and the further sense signal.

BRIEF DESCRIPTION OF THE FIGURES

Embodiments of the present invention will be described using the accompanying figures in which:

FIG. 10 shows a schematic top view of a vertical Hall device with additional floating contacts close to the ends of the two tubs;

FIG. 11 shows a schematic top view of a vertical Hall device with five contacts per tub;

FIG. 12 shows a schematic top view of a vertical Hall device with two tubs, each having five contacts, and simulation results illustrating an electrical potential distribution and a current density within the two tubs during a first operating phase;

DETAILED DESCRIPTION

In the following description embodiments of the present invention will be described in detail using the accompanying figures and it is pointed out that the same elements or elements having the same functionality are provided with the same reference numbers or similar reference numbers. A repeated description of elements provided with the same or similar reference numbers is typically omitted. Hence, descriptions provided for elements having the same reference numbers are mutually exchangeable.

In the following description, a plurality of details are set forth to provide a more thorough explanation of embodiments of the present invention. However, it will be apparent to one skilled in the art that embodiments of the present invention may be practiced without these specific details. Features of different embodiments described hereinafter may be combined with each other unless specifically noted otherwise.

Figure 1A:
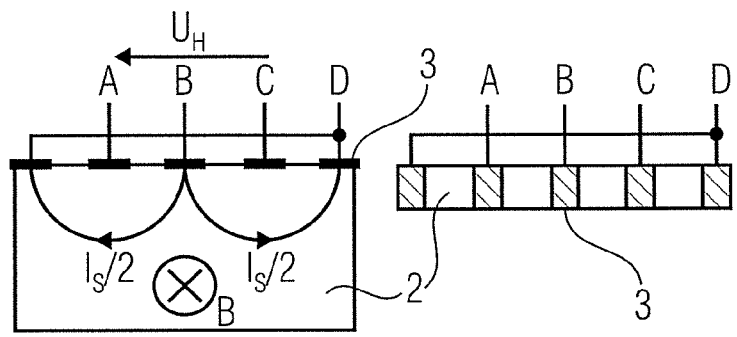
FIG. 1 shows a schematic cross-section of a known vertical Hall device with five contacts during a first operating phase and a second operating phase of a spinning current scheme.
Figure 1B:
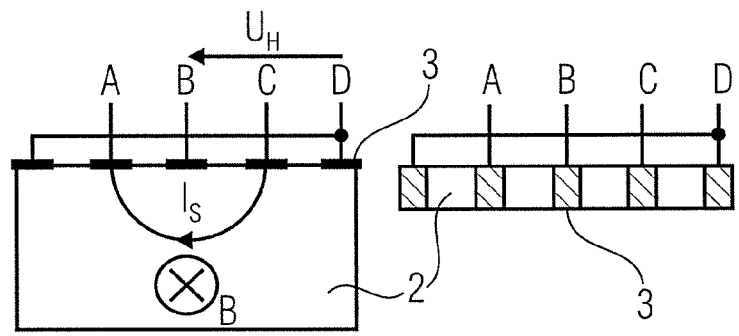

FIGS. 1a and 1b show a schematic cross-section and a corresponding schematic top view of a known vertical Hall device during two different operating phases. In FIG. 1a the vertical Hall device is shown during a first operating phase, while in FIG. 1b the vertical Hall device is shown during a second operating phase. The first and second operating phases correspond to different phases of a spinning current scheme according to which supply terminals and sense terminals of the vertical Hall device are swapped when passing from one operating phase to another operating phase. The vertical Hall device comprises a substrate 2, a plurality of contacts 3 and four terminals A, B, C and D. During the first operating phase (FIG. 1a) the terminals B and D serve as supply contacts. Accordingly, an electrical current is supplied to the vertical Hall device via terminal B and withdrawn or extracted from the vertical Hall device via the terminal D. The terminal B is connected to a center contact of the plurality of contacts 3. The terminal D is connected to two outmost contacts of the vertical Hall device. Hence, the supply current $I_S$ fed to the vertical Hall device via the terminal B splits up into approximately equal parts $I_S/2$ which flow through a tub or well within a substrate to the two outmost contacts and from there to the terminal D. A sense signal may be obtained by measuring a Hall voltage $U_H$ between the terminals C and A. The terminal A is connected to a contact between the center contact and the left outmost contact of the plurality 3 of contacts. The terminal C is connected to a contact between the center contact (connected to the terminal B) and a right outmost contact of the plurality 3 of contacts. A magnetic field component B that may be sensed using the vertical Hall device shown in FIG. 1a is perpendicular to a drawing plane of FIG. 1a and indicated by a corresponding symbol. In the absence of a magnetic field component B (B=0) the electrical potential distribution within the substrate of the vertical Hall device can be assumed to be substantially symmetrical with respect to a vertical center plane, i.e., passing through the center contact which is connected to the terminal B. Accordingly, the Hall voltage $U_H$ can be expected to be substantially zero. In other words, in the absence of a magnetic field B, the Hall voltage $U_H$ in FIG. 1, part a) is exactly zero (if we assume a perfectly symmetric geometry without tolerances).

In FIG. 1b, the vertical Hall device is shown during a second operating phase of the spinning current scheme. The electrical current is now supplied to the vertical Hall device via the terminal C and extracted from or withdrawn via the terminal A. The terminals D and B serve as sense terminals. The Hall voltage $U_H$ in part b) of FIG. 1 is usually not symmetric due to the asymmetry of contacts B and D.

Figure 2:
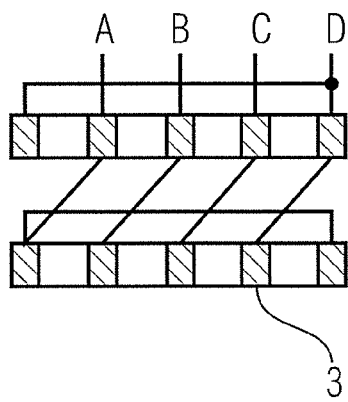
FIG. 2 shows a vertical Hall device comprising two known vertical Hall devices as depicted in FIG. 1.

FIG. 2 shows a schematic top view of a known vertical Hall device. Two vertical Hall devices are interconnected with each other in such a way that a particular contact of the first vertical Hall device is connected with a contact of the second vertical Hall device that corresponds, with respect to a geometrical arrangement of the contacts in or at the respective tub, to a left adjacent contact. In other words, the two tubs are interconnected in a shifted or offset manner.

FIG. 2 illustrates one option for making the known vertical Hall device symmetric. However, FIG. 2 illustrates an imperfect symmetrization because a perfectly symmetric device of FIG. 1a is connected with an asymmetric device FIG. 1b.

Figure 3:
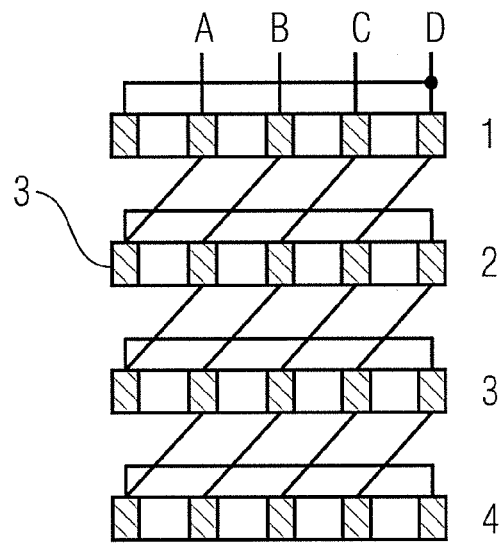
FIG. 3 shows a vertical Hall device comprising four interconnected, known vertical Hall devices as depicted in FIG. 1.

FIG. 3 illustrates an improved symmetrization with respect to FIG. 2, because each contact is connected with all other contacts, i.e., the contact in column A of tub 1 is connected with the contact of column D of tub 2 (via the interconnection of the two outmost contacts of each tub) and also with the contact in column C of tub 3 and also with the contact in column B of tub 4. Thus, no matter how asymmetric the single tub is, by means of the interconnection of the four tubs each having four terminals, the overall arrangement is highly symmetric. However, the high degree of symmetry comes at the expense of having at least four tubs which are connected in parallel to each other. In comparison to the vertical Hall device shown in FIG. 2, the vertical hall device shown in FIG. 3 requires double the space and consumes twice as much electrical power.

Figure 4:
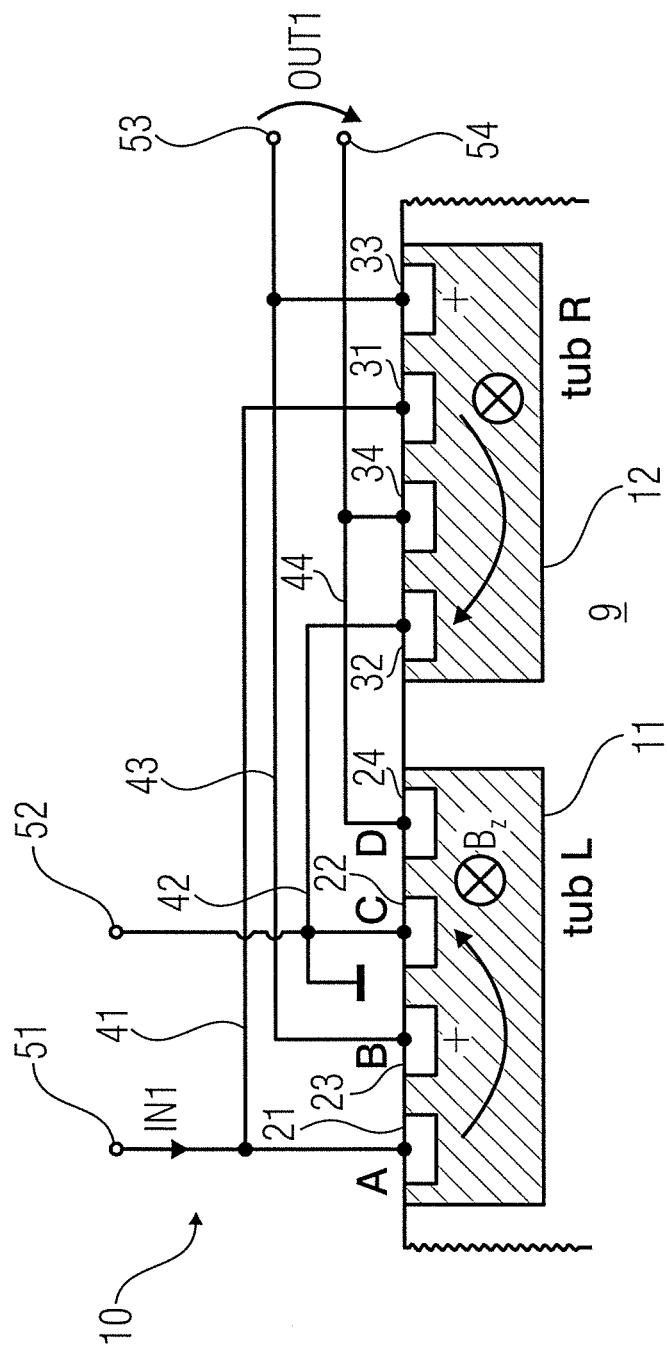
FIG. 4 shows a schematic cross-section of a vertical Hall device according to embodiments during a first operating phase.
Figure 5:
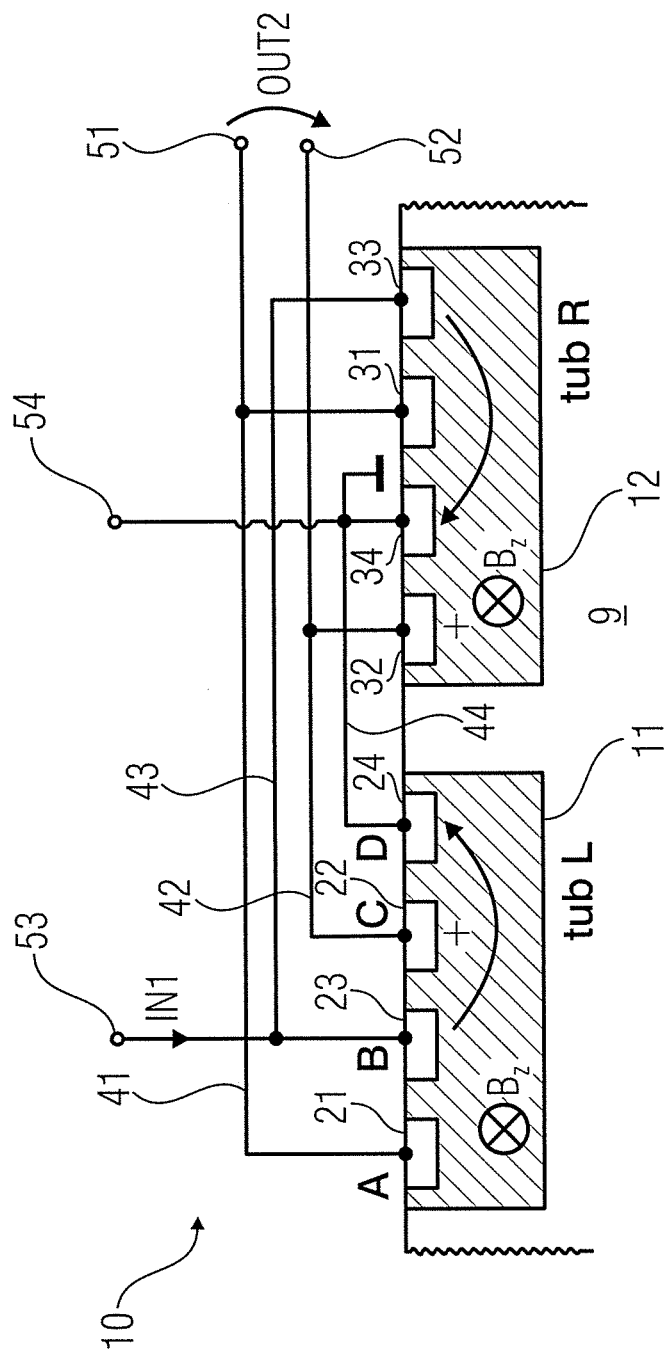
FIG. 5 shows a schematic cross-section of the vertical Hall device of FIG. 4 during a second operating phase of the spinning current scheme.

FIGS. 4 and 5 show schematic cross-sections of a vertical Hall device 10 according to at least one embodiment. FIG. 4 shows the vertical Hall device 10 during a first spinning phase of a spinning current scheme and FIG. 5 shows the vertical Hall device 10 during a second spinning phase of the spinning current scheme.

The vertical Hall device comprises a first tub 11 and a second tub 12 formed in a substrate 9. The first tub 11 and the second tub 12 each constitute a Hall effect region. Accordingly, a Hall effect region may be a tub or a well of a first conductivity type which is embedded in the substrate 9 or a tub of an opposite conductivity type. This structure may cause an electrical isolation of the tub against the substrate 9, in particular if the resulting pn-junction is reverse biased. However, it may also be possible that one tub comprises two or more Hall effect regions, in particular when two or more relatively distinct electrical current flows can be created within the tub. This may for example be achieved by effectively providing some sort of isolation of the two Hall effect regions.

When the vertical Hall device comprises two or more Hall effect regions, each Hall effect region may be isolated from each other. The electrical isolation of two Hall effect regions against each other may in embodiments use one of several forms. According to a first form of isolation, the two or more Hall effect regions are disjoined from each other, i.e., two adjacent Hall effect regions do not merge at one or more locations but are separated by material other than the Hall effect region material. As one possible option, the Hall effect region may be isolated in lateral direction by means of trenches which are typically lined and/or filled with a thin oxide. As another option, the Hall effect region may be isolated towards the bottom by means of an SOI (silicon-on-insulator) structure. Although the tub typically has a single conductivity type, it may be advantageous to configure the doping concentration in an inhomogeneous manner, i.e., spatially variable. In this manner a high concentration of the doping agent may occur in the area of the contacts as is usual with deep CMOS tub contacts. In the alternative, a layering of differently strongly doped layers may be sought after as is the case with, e.g., a conductive buried layer. Such a layering may result, to some extent, from technological reasons relative to other electronic structures that are formed within the substrate. The design of the vertical Hall device then may need to be reconciled with these circumstances even though the layering might, in fact, be unfavorable for the vertical Hall device.

The tub(s) may be an n-doped semiconductor as this provides about three times higher mobility and consequently a higher Hall factor than with a p-doped semiconductor. The doping concentration in the functional part of the tub is typically in the range of $10^{15}$ cm$^{-3}$ to $10^{17}$ cm$^{-3}$ in one embodiment.

Another possible material for the tubs or Hall effect regions is a nickel-iron magnetic alloy such as permalloy or a material similar to permalloy. Permalloy exhibits a low coercivity, near zero magneto restriction, high magnetic permeability and significant anisotropic magneto resistance. A variation of the electrical resistance of permalloy within a range of approximately 5% can typically be observed depending on the strength and the direction of an applied magnetic field. This effect may be used in a similar manner as the Hall effect occurring in a semiconductor for sensing and/or measuring a magnetic field and is known in the literature as the anomalous Hall effect.

Embodiments disclosed herein may be used in connection with a spinning current principle in which supply- and sense-terminals are exchanged in consecutive spinning phases. Spinning phases are sometimes also referred to as clock phases or operating phases. Hence, the contacts are configured to alternately function as a momentary supply contact and a momentary sense contact, i.e., to function as momentary supply/sense contacts in an alternating manner. A sense terminal in a vertical Hall device responds to an electric current passing by. A magnetic field (parallel to the die surface and perpendicular to the current streamlines) can effectively lift up or pull down the electrical potential at the contact (which is typically at the surface of the die). The term "vertical Hall effect" or "vertical Hall device" may be thought of as being based on the fact that the force due to the Hall effect in a vertical Hall device acts in a vertical direction (if the surface of the substrate is assumed to be horizontal). Besides a classification of Hall devices in "horizontal Hall devices" and "vertical Hall devices", they may also be distinguished regarding the direction in which the current flows in a region where it experiences the Hall effect. In a Hall device using the "vertical current mode", the electrical current substantially flows in a vertical direction with respect to the surface (which is assumed to be horizontal). In a Hall device using the "horizontal current mode", the electric current substantially flows in a horizontal direction, i.e., parallel to the substrate surface, at least in a region where the Hall effect acts on the electric current and can be sensed. In other words, the direction of the sensed magnetic field typically is parallel to the surface of the substrate and perpendicular to a line or curve passing through the contacts.

The Hall effect regions are typically formed in an isolated manner from each other for example in the same substrate, having an insulating structure or at least a substantially current-free region between them, or in two distinct substrates. The Hall effect regions may be galvanically connected in substantially parallel connection. An electric current enters the substantially parallel connection at a first supply terminal and leaves the substantially parallel connection at a second supply terminal.

In some configurations a conductive region, such as an n+ buried layer (nBL), may be present adjacent to a second surface of the Hall effect regions opposite to the first surface. According to embodiments, the contacts that are formed in the first surface(s) or on the first surface(s) of the Hall effect region(s) are electrically separated from the conductive region. In particular, no low-ohmic connection, such as one or more n+ sinker(s) exists between one of the contacts and the conductive region (e.g., the nBL). Rather, the contacts and the conductive region are separated by at least a portion of the relatively high-ohmic Hall effect region.

The vertical Hall device 10 shown in FIG. 4 further comprises a first group of contacts. In the embodiment according to FIG. 4, four contacts 21, 22, 23 and 24 are shown, however other embodiments may use different numbers of contacts as will be explained further below. The contacts 21, 22, 23 and 24 are arranged in or at a surface of the first Hall effect region 11. The first group of contacts 21, 22, 23 and 24 comprises two outmost contacts 21, 24 with respect to an arrangement in or at the surface of the first Hall effect region 11. A second group of contacts 31, 32, 33, and 34 is arranged in or at the surface of the second Hall effect region 12. The second group comprises two outmost contacts 32, 33 with respect to an arrangement in or at the surface of the second Hall effect region 12. The first Hall effect region 11 and the second Hall effect region 12 form a pair of Hall effect regions. The contacts 21 to 24 are configured to generated a Hall effect signal indicative of the magnetic field. "Generating a Hall effect signal" may refer to feeding an electrical current to the Hall effect regions 11, 12 and/or to sensing the Hall effect. A contact that is used to sense the Hall effect is referred to as a sense contact. One contact may serve as a supply contact during a first spinning phase and as a sense contact during a second spinning phase, e.g. in an alternating manner.

The outmost contacts of the first group or the second group may form a true subset of the first group or the second group, respectively. If the contacts belonging to, for example, the first group are arranged along a straight line, the first contact and the last contact on the line when moving along the line in one direction are the outmost contacts, while the remaining contacts are referred to as inner contacts. This may be in embodiments the line which is the shortest possible path containing all contacts of the first/second group. Again, the first and the last contact are outmost contacts. The line determining the outer and inner contacts when moving along a direction may be in some embodiments a line in a direction perpendicular to a maximum sensitivity direction of the vertical Hall device. The trajectory of the line or the path is typically contained within a conductive region within the substrate, i.e., the line or the path runs within the conductive region that forms the tub or the Hall effect region. This means that if the tub or the Hall effect region has a concave shape (e.g., a L-shape), the path reproduces this concave shape in order to stay within the tub/Hall effect region.

The outmost contacts may be the contacts closest to an opposing lateral boundary of the Hall effect region compared to other contacts.

In the vertical Hall device 10 illustrated in FIG. 4, the contacts 21 to 24 of the first group are arranged along a straight line. The same holds for the contacts 31 to 34 of the second group. However, in other embodiments arrangements may be used where the first and second group are not along a straight line. For example, in one embodiment the first contact and the second contacts may be along a curved or bended line. In embodiments, the first group of contacts and the second group of contacts may be arranged in a parallel manner. In embodiments, the first group of contacts and the second group of contacts may be each arranged along a line which has a substantially same direction.

The vertical Hall device 10 further comprises four terminals 51, 52, 53 and 54. Each of the four terminals, 51 to 54 is connected to exactly one of the outmost contacts 21, 24, 32 and 33 of the first group or the second group. The terminal 51 serves as a supply terminal during the first operating phase which is illustrated in FIG. 4. Accordingly, a supply current IN1 is provided to the vertical Hall device 10 via the terminal 51. The supply terminal 51 is connected to one of the outmost contacts of the first group, namely contact 21. The first supply terminal 51 is also connected to the inner contact 31 of the second group. In embodiments each of the first, second, third, and fourth terminals is connected to a same number of outmost contacts.

The device according to FIG. 4 forms a two-tubs-and-four-contacts-device since a pair of Hall effect regions having each four contacts is connected via the contacts to each other. Each Hall effect region may be formed in an associated tub, hence the shorthand designation "two-tubs-and-four-contacts-device". However, other configurations regarding the Hall effect regions and one or more tubs are not excluded by this designation. It is to be noted that the electrical connection between contacts of the two Hall effect regions is achieved via an electrical connection for example via conductive lines such as patterned metal wires connecting one contact from the first group of contacts with another contact from the second group of contacts. An electrical connection connecting a contact from one Hall effect region with a contact from another Hall effect region may be referred also as inter-connection. In a direct inter-connection between the two Hall effect regions, no other contact which functions as supply/sense contact may be in between. In some embodiments, all contacts from one group are connected via direct interconnections to a contact from another Hall effect region. In embodiments, at least one contact from the first group and the second group may be connected via a direct inter-connection.

The currents in the two Hall effect regions are flowing in opposite directions. As shown in FIGS. 4 and 5, the currents in each Hall effect region have a substantially same current distribution, however the directions of the current streamlines are exchanged. This may be valid for at least one particular configuration or value of the magnetic field (e.g., for a vanishing magnetic field or a zero-magnetic field). Each current flowing in one Hall effect region has a corresponding current with reversed current direction in the other Hall effect region. This results in current streamlines in the first Hall effect region being reversed to the current streamlines in the second Hall effect region. Or in other words, a current flow in one Hall effect region may be seen as substantially the mirrored view of a current flow in the other Hall effect region. Each current streamline generated by the first or third subset may be regarded as having a counterpart with opposite direction generated by the second or fourth subset. For each current streamline in the first Hall effect region a corresponding current streamline may be imagined to exist in the second Hall effect region with reverse flow direction.

The vertical Hall device schematically shown in FIGS. 4 and 5 is configured to utilize a first subset of the contacts from the first group 21 to 24 as a supply contact during the first operating phase. In the case of FIG. 4 the first subset comprises the contacts 21 and 22. A second subset from the second group of contacts 31 to 34 is utilized during the first spinning phase as supply contacts for the second Hall effect region 12. In FIG. 4 illustrating the first spinning phase the second subset comprises the contacts 31 and 32. In both the first subset and the second subset, the number of contacts is equal (two contacts per subset in the embodiment illustrated in FIGS. 4 and 5; other numbers are also possible).

During the second spinning phase shown in FIG. 5, a third subset of contacts from the first group of contacts 21 to 24 is utilized as supply contacts for the first Hall effect region 11. The third subset comprises the contacts 23 and 24. For the second Hall effect region 12, a fourth subset of the second group of contacts 31 to 34 is utilized as supply contacts. The fourth subset comprises the contacts 33 and 34. The third subset 23, 24 includes contacts of the first group that are not contained in the first subset 21, 22. In other words, the first subset and the third subset may be regarded as complementary in the first group of contacts. The fourth subset 33, 34 includes contacts of the second group that are not contained in the second subset 23, 24. In other words, the second and fourth subsets may be regarded as complementary in the second group of contacts.

FIG. 5 shows the two-tubs-and-four-contacts-device during a second spinning phase. The two Hall effect regions 11 and 12 are shown with four contacts each, namely the contacts 21 to 24 for Hall effect region 11 and the contacts 31 to 34 for Hall effect region 12. In the left Hall effect region 11 the electric current flows from left to right and in the right Hall effect region 12 the electric current flows from right to left. In other words, the currents in the two Hall effect regions are flowing also in the second spinning phase in opposite directions. Therefore, also in the second spinning phase, and while a magnetic field to be sensed has a particular configuration or value (e.g. the magnetic field vanishes and/or is substantially zero) the currents in each Hall effect region however have a substantially same current distribution with the directions of current flow being exchanged. This results also in the second spinning phase in a situation where electric current streamlines in the first Hall effect region are reversed to the current streamlines in the second Hall effect region. Or in other words, an electrical current flow in one Hall effect region is the mirrored view of a current flow in the other Hall effect region. For example, the electrical current flow may be mirrored relative to a mirror plane that is perpendicular to the surface of the substrate.

Therefore, in embodiments, in each phase of a spinning current scheme, a current in the first Hall effect region is opposite to a corresponding current in the second Hall effect region as described above.

It is also to be noted that the currents induced by the supply contacts generate the currents below the sense contacts of the first and second contacts such that the sense contacts of the first group have the currents in the reverse direction as the sense currents of the second group.

Trajectories of current streamlines generated by the first subset of contacts in the first Hall effect region may be opposite-identical to trajectories of current streamlines generated by the second subset of contacts in the second Hall effect region. A trajectory of a current streamline may be understood as a path along which an electrical charge travels through the corresponding Hall effect region when starting at a first contact of the contacts 21 to 24 (typically a supply contact). The electrical charge travels along the trajectory and eventually arrives at a second supply contact of the contacts 21 to 24. A strength or an amplitude of the electrical current/current density may be regarded as a the number of electrical charges that travel along the current streamline per unit of time. Hence, the trajectory per se may typically be regarded as substantially independent from the current density. Two opposite-identical streamlines or trajectories are exactly identical or substantially identical with respect to their shapes, but are opposite to each other with respect to the direction in which the electrical charge(s) travel along the streamline or trajectory.

Contacts B (reference signs 23 and 33) and C (reference signs 22 and 32) connect both Hall effect regions 11 and 12 so that the Hall signals generated by the first Hall effect region 11 and the second Hall effect region 12 add up, in an analogous manner as illustrated for the first operating phase in FIG. 4.

In the second operating phase (clock phase) the supply terminals 51, 52 and the sense terminals 53, 54 are exchanged. Again, the currents in both Hall effect region 11, 12 flow in opposite directions. Thus, the terminals 53, 54 constitute the supply terminals during the second operating phase. The terminals 51, 52 constitute the sense terminals during the second operating phase.

An additional third operating phase may be implemented where the directions of both electric currents of the first operating phase are reversed: then also the output signal between the sense terminals 53, 54 changes its sign. An additional fourth operating phase may be implemented where the directions of both electric currents of the second operating phase are reversed: then also the output signal between the terminals 51, 52 changes its sign.

The inputs IN1, IN2, . . . may be voltages or electrical currents. The outputs OUT1, OUT2, . . . may be voltages or electrical currents as well.

Although for the embodiment shown in FIGS. 4 and 5, the degree of symmetrization may not be as high as in FIG. 3, the embodiments herein achieve a substantial degree of symmetrization with reduced costs: the vertical Hall device shown in FIGS. 4 and 5 can be formed by only two Hall effect regions, for example two tubs as explained above. Thus, a device according to the described embodiment saves space and current consumption.

According to embodiments, the vertical Hall device may have one outmost contact of the first Hall effect region 11 connected (or "shorted") with one or at least one inner contact in the second Hall effect region 12, or vice versa.

The Hall effect regions 11 and 12 may be isolated from each other via reverse biased pn-junctions or via trenches coated with thin dielectric layers or other forms of electrical isolation, as explained above.

The geometric arrangement of the Hall effect regions may be along a straight line with their short sides next to each other, i.e., in a row similar to that shown in FIGS. 4 and 5. Yet the geometric arrangement may also be in a column with the long sides of the Hall effect regions 11, 12 next to each other.

By applying a constant or temperature dependent supply voltage to the suggested arrangement, different current values and ratios may result in different spinning phases. However, this typically does not degrade the residual output signal of the vertical Hall device in case of appropriate output node conditions. In particular, an output current may be sensed or evaluated instead of an output voltage. In some embodiments a substantially equal combination of control current distributions within the Hall device can be achieved by using a current-voltage biasing (Iu biasing). The term "Iu biasing" may be interpreted as "applying a current and measuring a voltage". Other options for biasing are Ui biasing (voltage-current biasing), Uu biasing (voltage-voltage biasing), and Ii biasing (current-current biasing). When using a Ui biasing (voltage-current biasing), a voltage is applied and an output current is measured (e.g., via a virtual short circuit of an operational amplifier arrangement).

An electrical connection of two Hall effect regions may be, for example, serial, parallel, anti-serial, or anti-parallel. Each Hall effect region comprises two supply contacts or groups of supply contacts. A first supply contact or group of supply contacts is connected to an upper supply potential. A second supply contact or group of supply contacts is connected to a lower supply potential. In the case of an anti-parallel connection the lower potential of the first Hall effect region is substantially identical to the lower potential of the second Hall effect region. The upper supply potential of the first Hall effect region is substantially identical to the upper supply potential of the second Hall effect region, as well. The supply contacts are arranged in a manner at the first and second Hall effect regions that the resulting electrical currents flow substantially in reverse directions. In the case of an anti-serial connection the electrical currents flow in opposite directions in the two Hall effect regions, as well. However, the lower supply potential of the first Hall effect region is substantially identical to the upper supply potential of the second Hall effect region. Moreover, the upper supply potential of the first Hall effect region is unequal to the upper supply potential and also to the lower supply potential of the second Hall effect region.

Other vertical Hall devices, as for example the vertical Hall devices shown in FIGS. 2 and 3, rely on a so called 90 degree connection between two or more Hall effect regions, whereas embodiments propose a 180 degree connection of at least two Hall effect regions. The 90 degree connection provides the same combination of current distribution in each spinning phase, but typically leads to different current streamlines in at least some of the Hall effect regions. In contrast, the 180 degree connection typically provides substantially identical current streamlines or trajectories in all Hall effect regions forming the 180 degree connection, even though with reversed directions in a subset (typically one half) of the Hall effect regions. At least some embodiments exhibit an electrical 180 degree symmetry.

Figure 6:
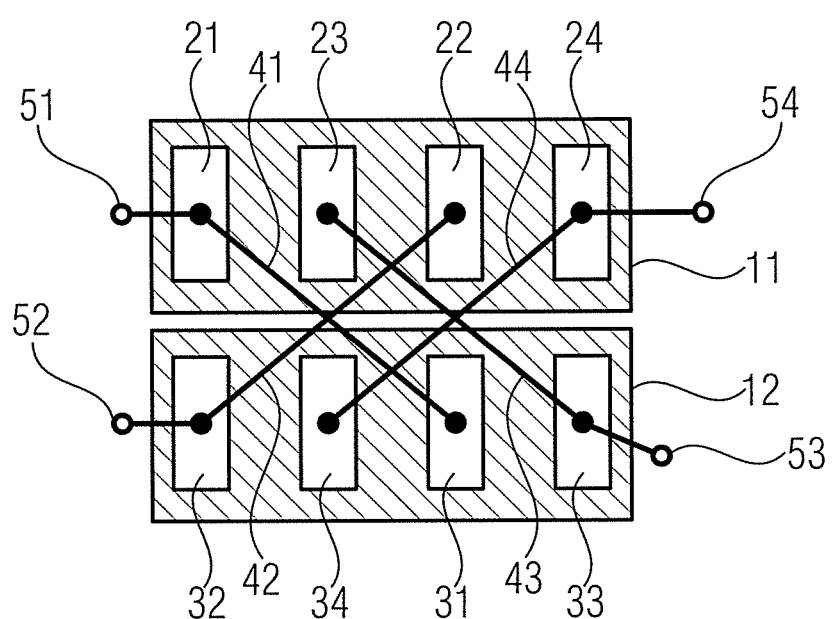
FIG. 6 shows a schematic top view of a vertical Hall device according to further embodiments.

FIG. 6 shows a schematic plan view of a possible column arrangement for the first spinning phase. As already described above in connection with the line arrangement shown in FIGS. 4 and 5, each of the terminals 51 to 54 is connected to exactly one outmost contact. The terminal 51 is connected to the outmost contact 21 of the first Hall effect region 11. The terminal 52 is connected to the outmost contact 32 of the second Hall effect region 12. The terminal 53 is connected to the outmost contact 33 of the second Hall effect region 12. The terminal 54 is connected to the outmost contact 24 of the first Hall effect region 11. In the embodiments shown in FIGS. 4, 5 and 6, each one of the terminals 51 to 54 is also connected to exactly one of the inner contacts. This allocation of each terminal to exactly one outmost contact and exactly one inner contact is possible due to the number of Hall effect regions (namely two Hall effect regions) and the number of contacts per Hall effect region (namely four contacts per Hall effect region). Furthermore, the four contacts per Hall effect region 11, 12 are arranged in an ordered manner along a straight line or along an open path. Thus, an order of the four contacts within the corresponding Hall effect region is defined when moving along the straight line or the path in one direction (e.g., from left to right or from −∞ to +∞, etc.). Due to this ordered arrangement within the Hall effect region, any set of contacts having a number of contacts equal to or greater than two has exactly two outmost contacts. The number of inner contacts is determined by the total number of contacts within the Hall effect region minus 2.

With respect to the geometric arrangement of the Hall effect regions 11 and 12, the second Hall effect region 12 may be offset arbitrarily by any translation in the layout with respect to the first Hall effect region 11. It is also possible to turn one device (e.g., the second Hall effect region 12) against the other (e.g., the first Hall effect region 11) in the layout. In this manner, an angled arrangement can be obtained, e.g., in the shape of an L. In this case, each Hall effect region 11, 12 is sensitive to different directions of the in-plane magnetic field and the system can use several devices like this to get at least two sensor signals and combine them to conclude on both in-plane components.

Figure 7:
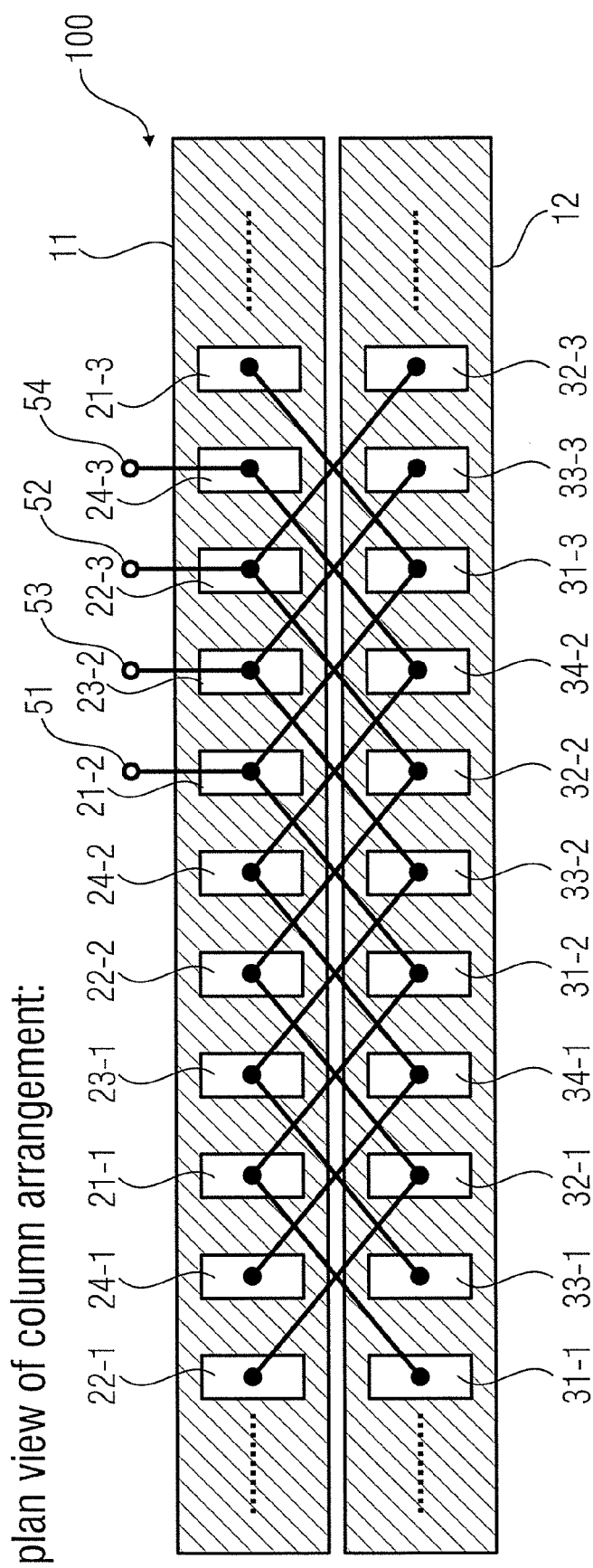
FIG. 7 shows a schematic top view of an arbitrarily long vertical Hall device according to other possible embodiments.

FIG. 7 shows a schematic plan view of a column arrangement of two Hall effect regions according to another embodiment. In particular, the embodiment illustrated in FIG. 7 is a generalization for arbitrarily long devices with four terminals 51, 52, 53 and 54. The vertical Hall device 100 shown in FIG. 7 comprises the first Hall effect region 11 and the second Hall effect region 12. The first group of contacts comprises contacts 21-1, 21-2, 21-3 formed in or at a surface of the first Hall effect region 11 and connected to the terminal 51. Furthermore, the first group comprises contacts 22-1, 22-2, 22-3 that are formed in or at the surface of the first Hall effect region 11 and connected to the terminal 52. Similarly, the contacts 23-1, 23-2 are connected to the terminal 53 and the contacts 24-1, 24-2, 24-3 are connected to the terminal 54. In a similar manner, the second group of contacts which are formed in or at the surface of the second Hall effect region 12 comprises four sub-groups which are connected to the terminals 51, 52, 53 and 54, respectively. The first sub-group (connected to terminal 51) comprises the contacts 31-1, 31-2, 31-3. The second sub-group (connected to terminal 52) comprises the contacts 32-1, 32-2, 32-3. The third sub-group (connected to terminal 53) comprises the contacts 33-1, 33-2, 33-3. The fourth sub-group (connected to terminal 54) comprises the contacts 34-1, 34-2. As indicated by the dotted lines in both Hall effect regions 11, 12 to the left and to the right of the illustrated contacts, the contact pattern may be extended in the directions of the main axes of the first Hall effect region 11 and the second Hall effect region 12. However, note that the current consumption of the vertical Hall device 100 illustrated in FIG. 7 is higher than the current consumption of the vertical Hall device 10 shown in FIGS. 4 to 6.

As can be observed from described embodiments, contacts of the first group, i.e. contacts associated with the first Hall effect region and contacts of the second group, i.e. contacts associated with the second Hall effect region are interconnected by a general rule. If the contacts of the first group are arranged in a sequence, for example in an order that increases from 1 to n and the contacts of the second group are arranged in a sequence for example in an order from 1 to n then for each m being an integer between 1 and n–2, the m-th contact of the first sequence of contacts is electrically connected to the (m+2)th contact of the corresponding contact in the second sequence, and the (m+2)th contact of the first sequence is electrically connected to the m-th contact of the second sequence.

For example, for the embodiment of FIG. 6 having n=4 contacts in each Hall effect region, with m=1 the first contact 21 of the first group is connected to the third contact 31 of the second group and the third contact 22 of the first group is connected to the first contact 32 of the second group. With m=2, the second contact of the first group is connected to the fourth contact of the second group and the fourth contact of the first group is connected to the second contact of the second group. It can be verified that the above rule is the interconnection scheme of the embodiment of FIG. 7 as well as for other embodiments described below.

The first sequence of n contacts may extend along a first direction and the second sequence of contacts may extend along a second direction. The first direction may be the same as the second direction or the first and second directions may be different.

Figure 8:
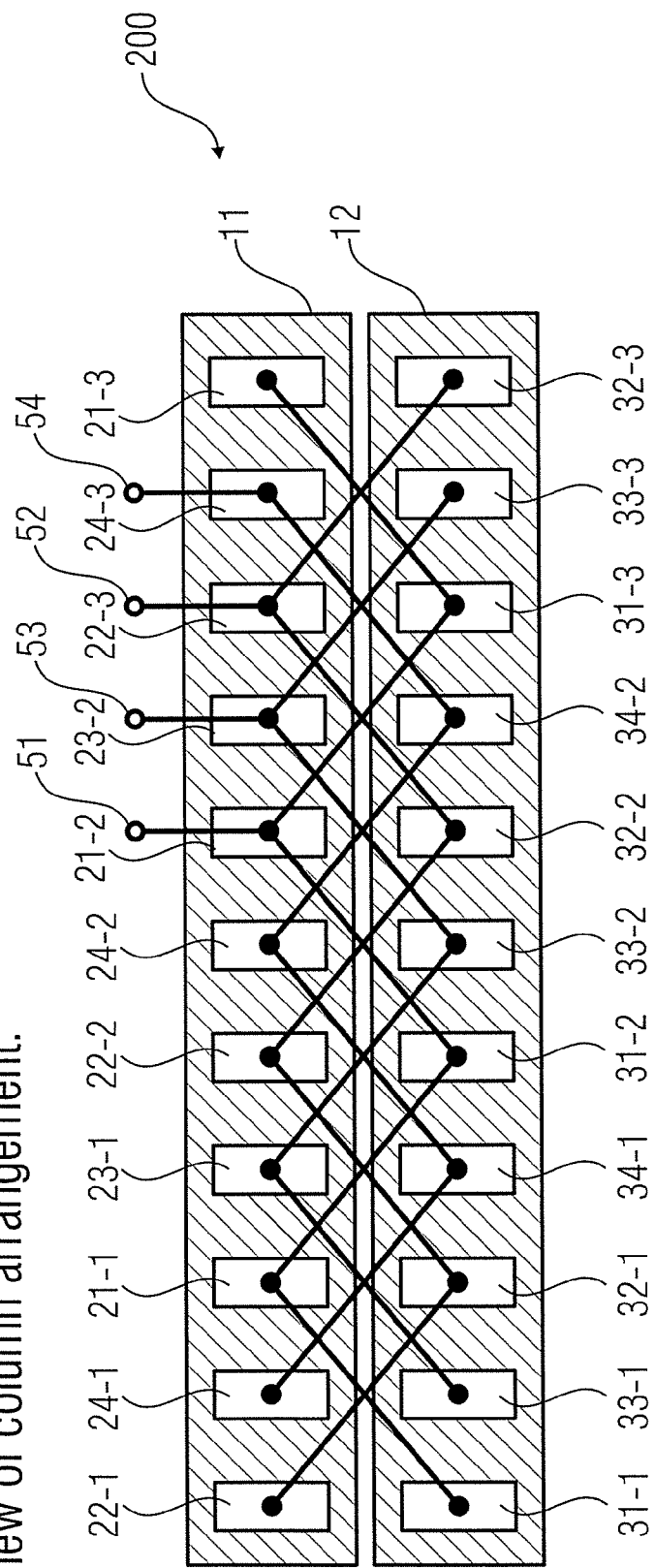
FIG. 8 shows a schematic top view of a vertical Hall device to illustrate a first possible option for the configuration of the ends of the two tubs.

FIG. 8 shows a schematic plan view of a vertical Hall device 200 to illustrate a first embodiment for the left and right ends of the two Hall effect regions 11, 12. The first group of contacts arranged in or at the surface of the first Hall effect region 11 comprises 11 contacts. The second group of contacts arranged in or at the surface of the second Hall effect region 12 also comprises 11 contacts. The outmost contacts 22-1 and 21-3 of the first group, i.e., associated to the first Hall effect region 11, are connected to the terminal 52 and the terminal 51, respectively. The outmost contacts 31-1 and 32-3 of the second group, i.e., associated to the second Hall effect region 12, are connected to the terminal 51 and the terminal 52, respectively.

The vertical Hall device 200 thus comprises at least the two Hall effect regions 11, 12 in the substrate (substrate not shown in FIG. 8). Each of the two Hall effect regions 11, 12 has at least five contacts which are wired up in such a way that the overall configuration has four terminals 51, 52, 53 and 54. Two terminals 51, 52 are used as supply terminals and two terminals 53, 54 are used as sense terminals in the first operating phase of the spinning current scheme. In the second operating phase the roles of the supply and sense terminals are swapped. During supply of an electrical current via the supply terminals, current stream lines in the first Hall effect region 11 are (for a vanishing magnetic field) substantially the same as in the second Hall effect region 12, yet with opposite direction of current flow. This holds for both operating phases. In particular, the current streamlines within a first portion of the first Hall effect region 11 are opposite to the current streamlines in a corresponding portion of the second Hall effect region 12. For example, during the first operating phase an electrical current is supplied to the first Hall effect region 11 via the terminal 51 and, in consequence, a portion of this electrical current is injected into the first Hall effect region 11 via the contact 21-2. The electrical current is withdrawn from the vertical Hall device 200 via the terminal 52 so that, in consequence, a portion of the electrical current within the first Hall effect region 11 is withdrawn from the first Hall effect region 11 via the contact 22-3. This means that in a portion of the first Hall effect region 11 extending between the contact 21-2 and the contact 22-3 the current streamlines are directed substantially from left to right in the representation according to FIG. 8. As far as the second Hall effect region 12 is concerned, it can be seen that the terminal 51 is connected to the contact 31-3 which is vertically aligned (i.e., with respect to the orientation of FIG. 8) with the contact 22-3 within the first Hall effect region 11. It can also be seen that the terminal 52 is connected to the contact 32-2 which is vertically aligned with the contact 21-2 in the first Hall effect region 11. Therefore, the electrical current streamlines in a portion of the second Hall effect region 12 extending from the contact 32-2 to the contact 31-3 are substantially directed from right to left, i.e., in the opposite direction than the current streamlines in the corresponding portion of the first Hall effect region 11.

The allocation of different portions of the first Hall effect region 11 to corresponding portions in the second Hall effect region 12 may also be based on another criterion than a vertical alignment or column-wise alignment as it may be used in connection with a column arrangement of the first Hall effect region 11 and the second Hall effect region 12. For example, a correspondence between portion in the first Hall effect region 11 and the second Hall effect region 12 may be based on a similarity of the first and second Hall effect regions 11, 12. For example, the first and second Hall effect regions 11, 12 may be substantially longitudinal and, therefore, comprise a first end and a second end, respectively. Between the first end and the second end, each Hall effect region 11, 12 may be divided in corresponding portions or sections.

In the embodiment shown in FIG. 8, at least one outer contact (i.e., contact 22-1 or contact 21-3) of the first Hall effect region 11 is electrically connected with a center contact (i.e., contacts 32-1, 32-2 and contacts 31-2, 31-3, respectively) of the second Hall effect region 12. In a similar manner, at least one outer contact (i.e., contact 31-1 or contact 32-3) of the second Hall effect region 12 is electrically connected with a center contact (i.e., contacts 21-1, 21-2 and contacts 22-2, 22-3) of the first Hall effect region 11. In the embodiment shown in FIG. 8, the outer contacts 22-1, 21-3, 31-1 and 32-3 are temporarily used as sense contacts, namely during the second operating phase. During the first operating phase, these outmost contacts 22-1, 21-3, 31-1 and 32-3 are used as supply contacts.

Figure 9:
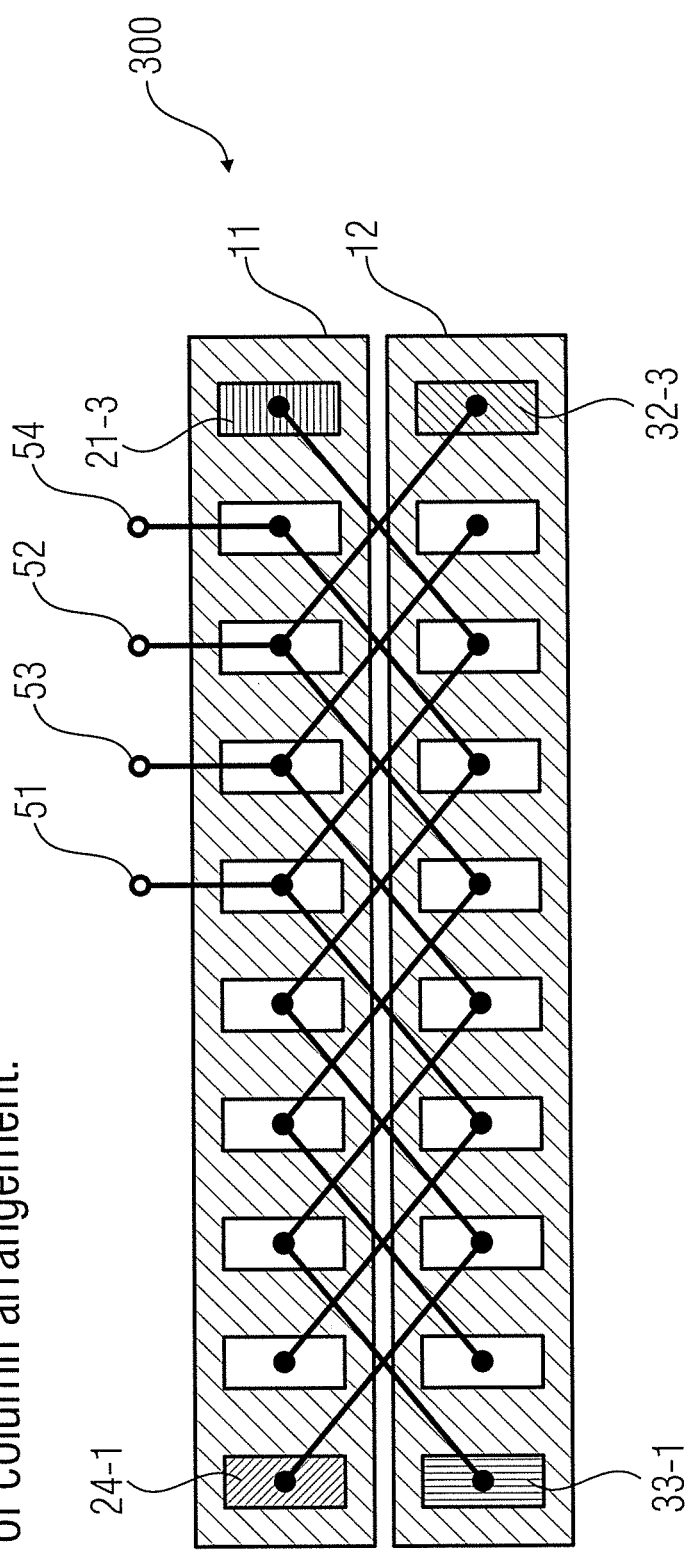
FIG. 9 shows a schematic top view of a vertical Hall device to illustrate a second option for a configuration of the ends of the two tubs.

FIG. 9 shows a schematic plan view of a vertical Hall device 300 according to a further embodiment. The vertical Hall device 300 comprises the first Hall effect region 11 and the second Hall effect region 12 which are arranged in a column arrangement. As already mentioned above, other arrangements of the first and second Hall effect regions 11, 12 are also possible. In particular, the first and second Hall effect regions 11, 12 may be arranged with respect to each other according to one of the following arrangements: aligned arrangement, parallel arrangement, column arrangement or angled arrangement. According to the aligned arrangement a longitudinal axis of the first Hall effect region 11 and a longitudinal axis of the second Hall effect regions 12 are aligned. According to the parallel arrangement, the longitudinal axis of the first and second Hall effect regions 11, 12 are parallel and offset to each other. According to the column arrangement (as shown in FIGS. 6 to 9), the second Hall effect region 12 is offset to the first Hall effect region 11 in a direction orthogonal to the longitudinal axis of the first and second Hall effect region 11, 12.

The first group of contacts in the first Hall effect region 11 has 10 contacts. The second group of contacts also has 10 contacts which are arranged in or at the surface of the second Hall effect region 12. The first group of contacts is arranged along a straight line which is parallel to or coincides with the longitudinal axis of the first Hall effect region 11. The second group of contacts is arranged along a straight line which is parallel to or coincides with the longitudinal axis of the second Hall effect region 12.

The number of ten contacts per Hall effect regions fulfils the condition 4*n+2, wherein n is a natural number. Thus, each terminal of the four terminals 51, to 54 is connected to exactly one of the outmost contacts 24-1, 21-3, 33-1, and 32-3. For illustration purposes, the outmost contacts are indicated by different fill patterns.

The number of contacts that are connected to the four terminals 51 to 54 per Hall effect region is even (10 in the example shown in FIG. 9) because then each terminal is connected to exactly one outmost contact (as symbolized by the four different patterns of the outmost contacts). At the same time the number of contacts per terminal may be odd (five in the example shown in FIG. 9) or even (if two contacts per Hall effect region are added to the embodiment shown in FIG. 9).

The first group of contacts comprises at least one inner contact and the second group of contacts also comprises at least one inner contact, namely eight inner contacts for each group of contacts. Each of the inner contacts of the first group is connected to exactly one of the outmost contacts 24-1, 21-3, 33-1 and 32-3.

FIG. 10 shows a schematic plan view of a vertical Hall device 400 according to embodiments. The vertical Hall device 400 is similar to the vertical Hall device 300 shown in FIG. 9. In addition, the vertical Hall device 400 comprises four further contacts 61, 62, 63 and 64. The further contacts do not belong to the first group or the second group. In other words, the further contacts 61, 62, 63 and 64 are not used to supply a current or sense the Hall effect. In particular, the further contacts 61 to 64 are not electrically connected to one of the four terminals 51 to 54. Each of the further contacts 61 to 64 is arranged between one of the outmost contacts 24-1, 21-3, 33-1 and 32-3 and an end of a corresponding Hall effect region 11, 12 which is nearest to said one of the outmost contacts. The further contacts 61 to 64 may be floating contacts that may be provided in order to reduce margin effects occurring close to the ends of the first and second Hall effect regions 11, 12, for example. The further contacts 61 to 64 may be connected to each other. For example, the further contact 61 may be connected to the further contact 63 via an electrical connection 65, as illustrated in FIG. 10. Likewise, the further contact 62 may be connected to the further contact 64 via an electrical connection 66. An outmost contact or outer contact may be a contact that is closest to a first end or a second end of the corresponding Hall effect region 11, 12 and connected to one of the terminals 51 to 54. An addition of further floating contacts or contacts that are not used as supply or sense terminals, which are closer to the first or second ends of the corresponding Hall effect region, do not provide outmost contacts or outer contacts in this context. In other words, the contacts of the first and second groups includes only contacts which are used in spinning phases to supply a current or to sense the Hall effect.

FIG. 11 shows a schematic plan view of a vertical Hall device 500 according to a further embodiment. The embodiment shown in FIG. 11 is a two-tubs-and-five-contact-device. The vertical Hall devices comprises two Hall effect regions that are connected in such a way that in both spinning phases the currents in the two Hall effect regions 11, 12 flow in opposite directions (at vanishing magnetic field). A highly conductive bottom may be assumed for both Hall effect regions (i.e., an n-buried layer, nBL).

The vertical Hall device 500 is indicative of magnetic field parallel to the surface of the substrate (substrate not shown in FIG. 11) with at least two Hall effect regions 11, 12 in the substrate each having at least five contacts. The at least five contacts per Hall effect region 11, 12 are wired up in such a way that the overall configuration has four terminals 51, 52, 53, and 54. Two of the four terminals, for example the terminals 51 and 52, are used as supply terminals and the two other terminals, for example the terminals 53 and 54, are used as sense terminals in a first operating phase of a spinning current scheme. In a second spinning phase of the spinning current scheme supply and sense terminals are swapped. The current streamlines in the first Hall effect region are essentially the same as in the second Hall effect region in both spinning phases yet with opposite direction of current flow in the second Hall effect region 12 compared to the first Hall effect region 11 (again, for a vanishing magnetic field to be sensed by the vertical Hall device).

At least one outer contact of the first Hall effect region 11 is shorted with a center contact of the second Hall effect region 12. At least one outer contact of the second Hall effect region 12 is shorted with a center contact of the first Hall effect region 11.

Furthermore, the outer contacts of the first Hall effect region 11 are shorted. Likewise, the outer contacts of the second Hall effect region 12 are also shorted (shorted=electrically connected with).

It may be observed that the vertical Hall device 500 having 2 Hall effect regions with 5 contacts may be formed by cutting out from the embodiment shown in FIG. 7 a region of 5 contacts in both tubs.

FIG. 12 shows a schematic cross-section through a vertical Hall device 600 having two Hall effect regions 11, 12 and five contacts per Hall effect region. During the first operating phase which is illustrated in FIG. 12, an electric current is fed to the first Hall effect region 11 via the contact 21 (C3). The contact 21 is electrically connected to two contacts 31-1, 31-2 of the second Hall effect region 12 so that an electrical current is provided to the second Hall effect region 12 via these two contacts 31-1, 31-2. Within the first Hall effect region 11, the electrical current divides up into approximately equal parts, one flowing towards the left to a contact 22-1 and the other part flowing to the right to a contact 22-2. In the second Hall effect region 12, the two parts of the electric current injected via the contacts 31-1 and 31-2 flow to the center contact 32, from the left and the right, respectively. The contacts 22-1 and 22-2 are outmost contacts of the first Hall effect region 11 and are electrically connected to the contact 32 of the second Hall effect region 12. A sense signal for the first Hall effect region 11 may be sensed between the contacts 23 (C2) and 24 (C4). A sense signal for the second Hall effect region 12 may be sensed between the contacts 33 and 34. The contacts 23 and 33 are electrically connected (shorted). The contacts 24 and 34 are also electrically connected (shorted).

FIG. 12 illustrates that during the first operating phase of the spinning current scheme an electrical current is supplied to the first Hall effect region 11 via an inner contact, namely the center contact 21 which is located on the symmetry axis of the first Hall effect region 11 with respect to a left-right symmetry. The electrical current is extracted from the first Hall effect region 11 via two outmost contacts 22-1, 22-2. In the second Hall effect region 12 the situation is substantially inverted. The electrical current supplied to the second Hall effect region 12 is injected via two outmost contacts 31-1, 31-2 and extracted from the second Hall effect region 12 via an inner contact, namely the center contact 32.

The lower part of FIG. 12 shows a result of a numerical simulation for an electrical potential distribution and for electrical current streamlines within the first and second Hall effect region 11, 12 valid for the first operating phase of the spinning current scheme. For the purpose of the simulation a magnetic field of 0.1 T in the z-direction (i.e., perpendicular to the drawing plane of FIG. 12) has been assumed. The contacts 21, 31-1 and 31-2 are connected to an electrical potential of 1 V. The contacts 22-1, 22-2 and 32 are grounded (i.e., they are at an electrical potential of 0 V). Both Hall effect regions 11, 12 are assumed to comprise a highly conductive bottom, e.g., an n+ doped buried layer (nBL). For this reason, some of the current lines disappear in and/or reappear from the nBL. The nBL of the first Hall effect region 11 is at an electrical potential of approximately 0.35 V whereas the nBL of the second Hall effect region 12 is at an electrical potential of approximately 0.6 V.

Figure 13:
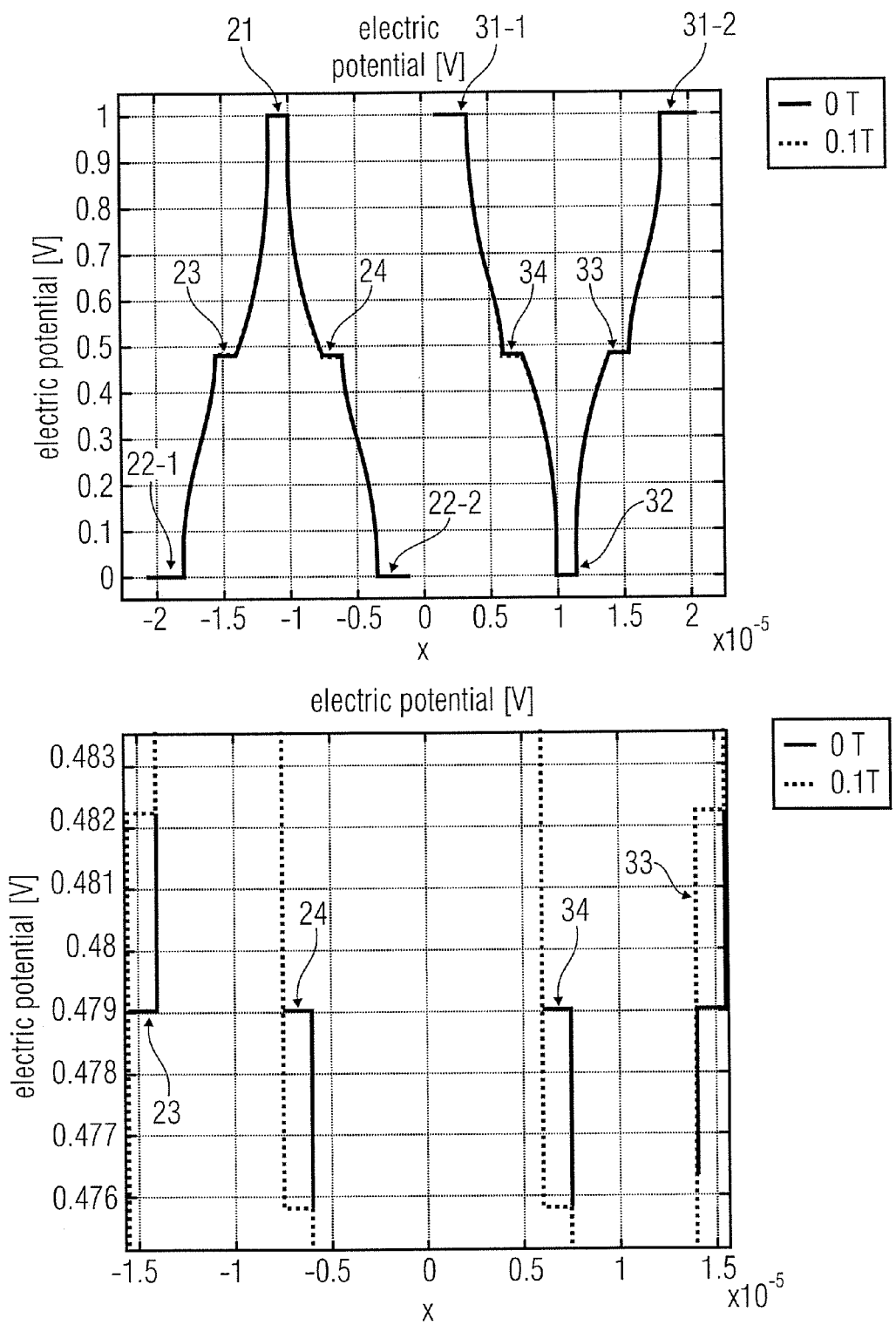
FIG. 13 schematically illustrates an electrical potential distribution along a surface of the substrate for the vertical Hall device shown in FIG. 12 and for two different magnetic field strengths, wherein the lower part of FIG. 13 is a close-up of the upper part of FIG. 13.

FIG. 13 illustrates a distribution of the electrical potential along the x-axis at a surface of the first and second Hall effect regions 11, 12 (y=0) for two different magnetic field strengths of the magnetic field component in the z-direction Bz (perpendicular to the drawing plane in FIG. 12). A first curve drawn in full stroke corresponds to a magnetic field strength Bz=0 T and a second curve drawn in dashed line corresponds to a magnetic field Bz=0.1 T. The upper part in FIG. 13 shows the entire potential distribution from $x=-2\times10^{-5}$ m to $x=+2\times10^{-5}$ m and the entire range of the electric potential from 0V to 1V. It can be seen that the differences between the 0 T-curve and the 0.1 T-curve are rather small.

The lower part of FIG. 13 shows a close-up of the interval $x=-1.5\times10^{-5}$ m to $x=+1.5\times10^{-5}$ m, as well as for the electric potential range from approximately 0.475V to approximately 0.483V.

It can be seen in FIG. 13 that the common mode potential is slightly below 0.5V due to back-bias effects. In particular, the lower, zoomed part of the electric potential distribution in FIG. 13 reveals that a systematic offset is 0 with a very high precision because the sense contacts 23 and 24 are on equal potential for the 0 T case. From a practical point of view, the systematic offset may even be regarded as being exactly 0 because the contacts 23, 24 may be regarded as being exactly on equal potential for the 0 T case. Note that the contact 34 of the second Hall effect region 12 is connected to the contact 24 of the first Hall effect region 11. Moreover, the contact 33 of the second Hall effect region 12 is connected to the contact 23 of the first Hall effect region 11. For this reason, the contacts 34 and 33 may also be regarded as being on exactly the same electrical potential in the 0 T case.

The systematic offset being substantially 0 is a direct consequence of the symmetrization by the 180° anti-parallel-connection.

The dashed curve for the 0.1 T case shows a 6.4 mV difference between the contacts 23 and 24, which gives a magnetic sensitivity of 64 mV/V/T.

Figure 14:
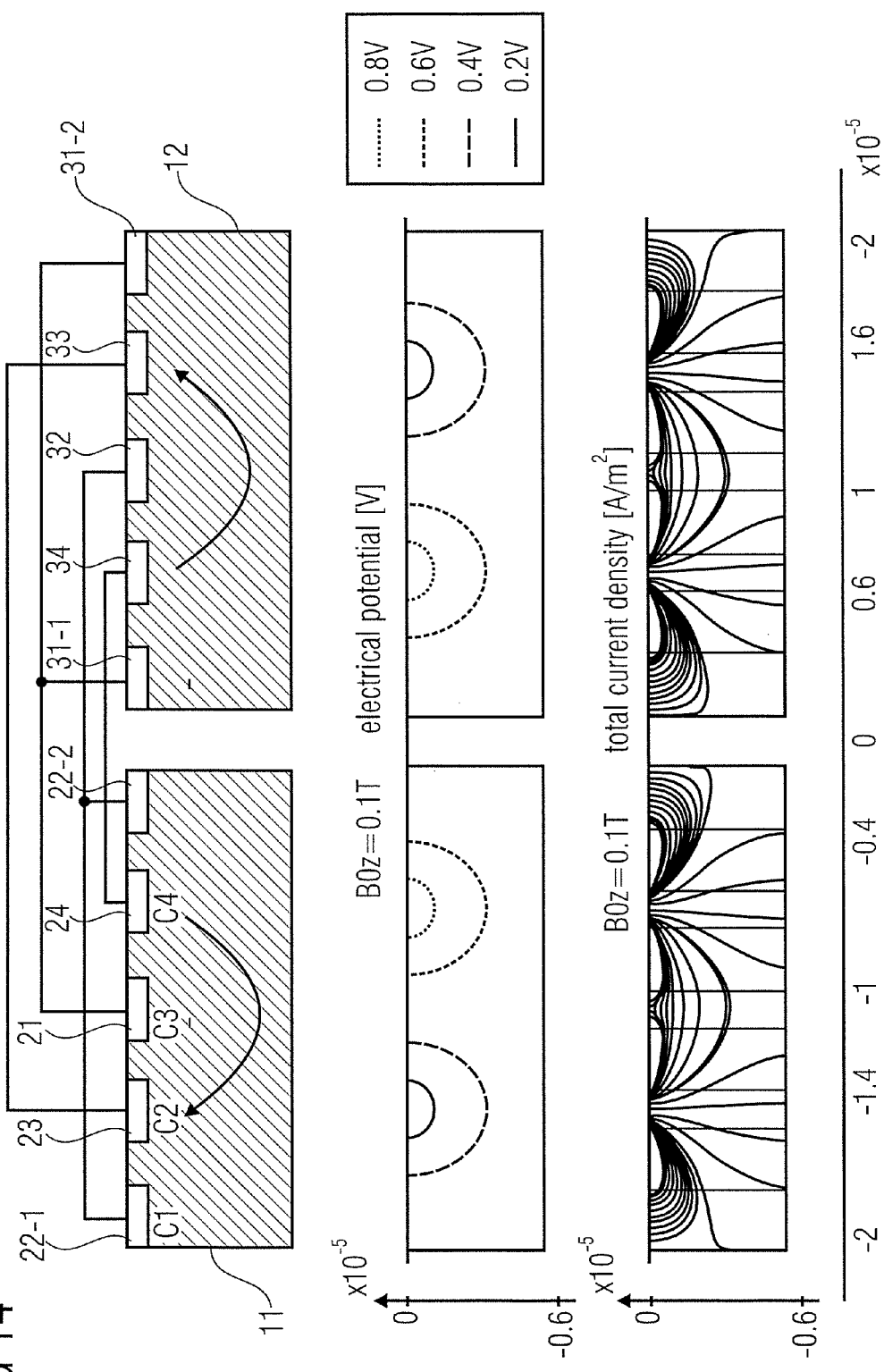
FIG. 14 shows a schematic cross-section of the vertical Hall device from FIG. 12 during a second operating phase and corresponding simulation results for the electrical potential distribution and the current density.

FIG. 14 corresponds to FIG. 12, however, for the second operating phase of the spinning current scheme. Accordingly, the electrical current is now supplied to the first Hall effect region 11 via the contact 24 and extracted from the first Hall effect region 11 via the contact 23. At the second Hall effect region 12, the electrical current is supplied via the contact 34 and extracted via the contact 33. The contacts 22-1, 22-2 and 21 function as sense contacts for the first Hall effect region 11 during the second operating phase. The contacts 31-1, 31-2 and 32 function as sense contacts for the second Hall effect region 12 during the second operating phase illustrated in FIG. 14.

The lower part of FIG. 14 shows the result of the numerical simulation for the second operating phase and a magnetic field strength of 0.1 T in the z-direction. An electrical potential of 1V has been applied to contacts 24 and 34, while contacts 23 and 33 are grounded.

Figure 15:
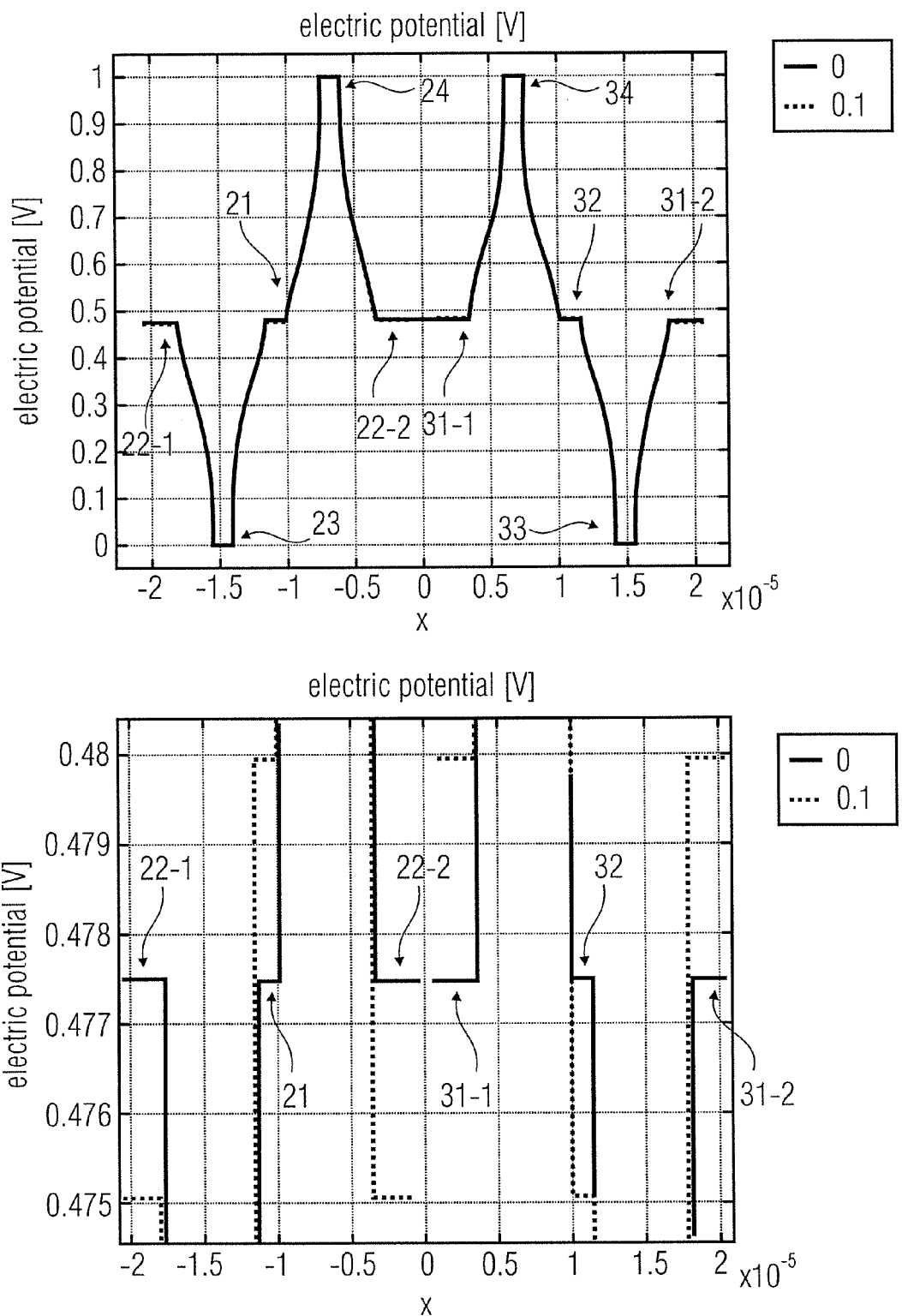
FIG. 15 schematically illustrates an electrical potential distribution along a surface of the substrate of the vertical Hall device of FIG. 14 for two different magnetic field strengths, wherein the lower part of FIG. 15 is a close-up of a particular area of the upper part of FIG. 15.

FIG. 15 illustrates the distribution of the electrical potential along the x-direction at the surface of the first and second Hall effect regions 11, 12 for 0 T (full stroke line) and 0.1 T (dashed line) as the magnetic field strengths along the z-direction (perpendicular to the drawing plane of FIG. 14). It can be seen in FIG. 15 that the common mode is again not at 0.5V due to back-bias effects. The zoomed portion shown in the lower part of FIG. 15 shows that the common mode potential in the second operating phase is approximately at 477.5 mV which is not identical to the common mode potential during the first operating phase (479 mV). However, the systematic offset in the second operating phase is also 0 with a high degree of precision (it may be regarded as being substantially exactly 0). Thus, the anti-parallel connection according to embodiments provides a powerful tool to reduce systematic offsets due to back bias for non-symmetric devices.

From the dashed curve corresponding to the 0.1 T case, it can be deduced that the magnetic sensitivity is 48.84 mV/V/T.

It can be seen that the anti-parallel connection of two 5-contact vertical Hall devices provides relatively good results and improvements over known devices. Such a vertical Hall device disclosed herein is capable of cancelling systematic raw offsets in both operating phases. Moreover, it offers a relatively good magnetic sensitivity.

Figure 16A:
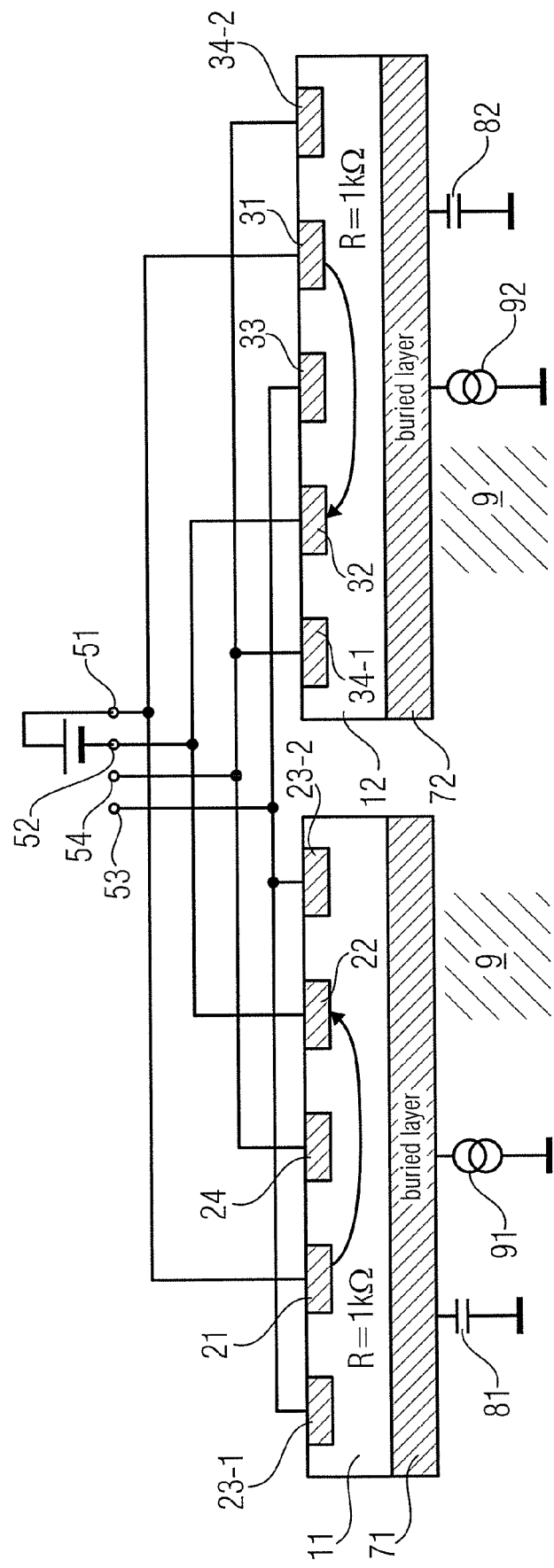
FIGS. 16A and 16B show schematic cross sections of a vertical Hall device according to embodiments having a buried layer during a first spinning phase and a second spinning phase.
Figure 16B:
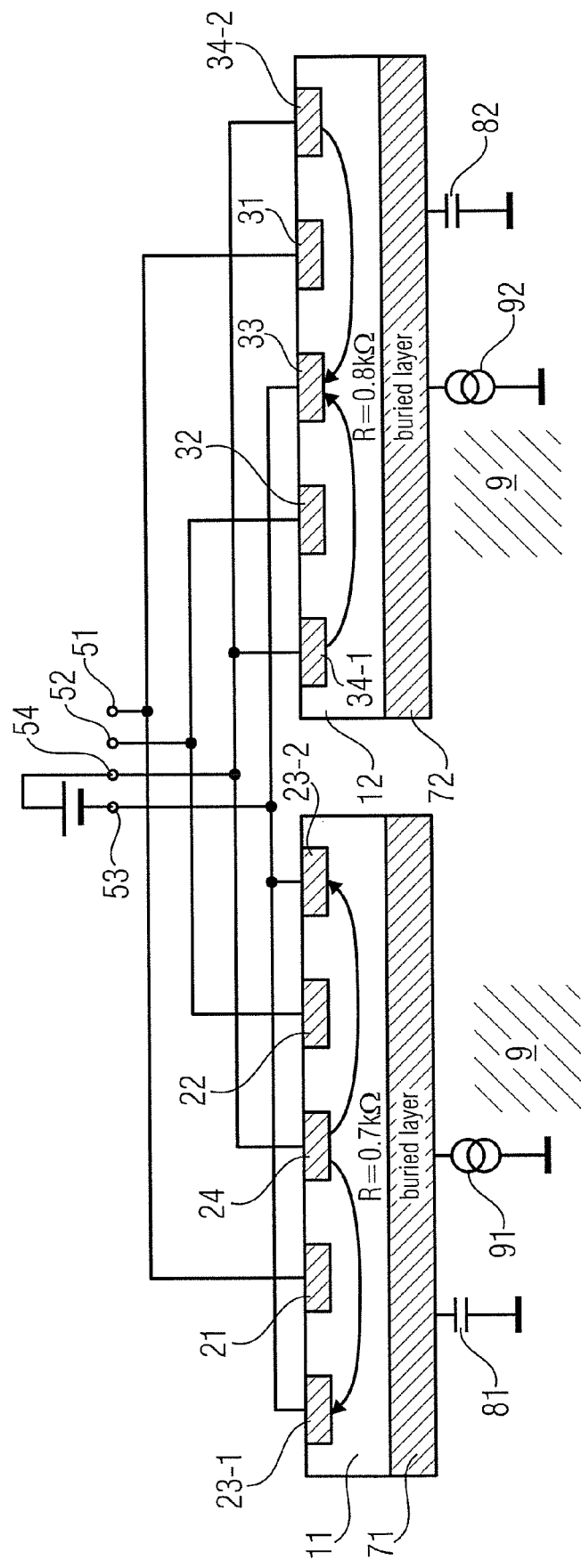

FIGS. 16A and 16B show schematic cross sections of a two-tubs-and-five-contacts device according to embodiments during a first spinning phase (FIG. 16A) and a second spinning phase (FIG. 16B). The vertical Hall device comprises two Hall effect regions 11, 12 which are connected in an antiparallel manner or, in other words, according to a 180 degrees interconnection. The term antiparallel interconnection relates to the reverse directions of current flow within the first Hall effect region 11 and the second Hall effect region 12 that typically may be observed at least for a particular value of the magnetic field to be sensed, e.g. for a vanishing magnetic field.

A first buried layer 71 is adjacent to a surface of the first Hall effect region 11, the surface being opposite to the surface where the contacts 21, 22, 23-1, 23-2, and 24 are arranged. A second buried layer 72 is adjacent to the second Hall effect region 12 at a surface that is opposite to the surface where the contacts 31 to 33, 34-1 and 34-2 are arranged. The buried layers 71, 72 are typically highly conductive layers. In case the buried layers 71, 72 are formed by n+ doped regions, they are sometimes referred to as nBL (n+ doped buried layer). At the buried layers 71, 72 an electrical potential can be observed that is approximately the average of the upper and lower supply potentials provided to the Hall effect regions 11, 12 by means of the supply terminals 51, 52 and the supply contacts 21, 22, 31, and 32. As the substrate 9 typically is at a different electrical potential (for example, an electrical ground potential of an electronic device or semiconductor chip comprising the vertical Hall device), the buried layers 71, 72 form parasitic capacitances 81, 82 with the substrate 9. Moreover, a leakage current can also be observed between the buried layer 71, 72 and the substrate 9. The leakage currents are represented in FIGS. 16A and 16B by current sources 91 and 92. When the vertical Hall device changes from the first spinning phase to the second spinning phase, the capacitances 81, 82 need to be reloaded, as in the two spinning phases different electrical potential distributions may be established, which causes an electrical potential of the buried layers 71, 72 to vary. Especially vertical Hall devices may need to be operated at a relatively high frequency, the so called chopper frequency. On the other hand, the leakage currents represented by the current sources 91, 92 show only a weak dependency on the electrical potential and/or the electrical potential distribution. For an antiparallel interconnection the leakage currents in the two Hall effect regions substantially may compensate each other. In at least some embodiments, a contribution of the leakage currents are substantially equal at the sense terminals during one spinning phase, while in another spinning phase the leakage currents are substantially negligible as one of the leakage currents is shorted to ground (e.g., the lower supply potential) and the other is shorted to a supply potential or bias supply potential (e.g., the upper supply potential).

As can be seen in FIG. 16A, for a particular magnetic field an approximately equal current distribution, yet with reversed direction of current flow, can be observed in the first and second Hall effect regions 11, 12. As an example, a first resistance between the supply contacts 21, 22 of the first Hall effect region 11 is indicated as 1 kOhm. A corresponding resistance between the supply contacts 31, 32 of the second Hall effect region 12 is indicated as 1 kOhm, too.

The situation is slightly different during the second spinning phase which is schematically illustrated in FIG. 16B. The first resistance between the supply contacts 24 and 23-1, 23-2 of the first Hall effect region 11 is 0.7 kOhm, whereas the second resistance between the supply contacts 34-1, 34-2 and 33 is 0.8 kOhm. A reason for this may be that outmost contacts such as the contacts 23-1, 23-2, 34-1, and 34-2 may be more affected by boundary effects than the center contacts. Such boundary effects may be caused by junction field effects and MOS field effects. As result the current ratio may not be the same in each spinning direction, but a symmetric resistance and current distribution in spinning phases with opposite current injection is achieved by the described embodiment.

With respect to the parasitic capacitances 81, 82 and the leakage currents 91, 92, a capacitive symmetry and a leakage symmetry may be present. This symmetry may be considered as countering or alleviating a back bias effect that may occur within the Hall effect regions 11, 12. Hence, the buried layers 71, 72 may have a positive effect on a symmetry of the vertical Hall device.

When only a few Hall effect regions are connected in parallel it may be relatively easy to measure the vertical Hall voltage with an on-chip wire and an applied current (the more narrow the wire, the higher the created field). Moreover, the area consumption of a vertical Hall device having, for example, two Hall effect regions only is smaller than the area consumption of a vertical Hall device having, for example, four Hall effect regions.

Figure 17A:
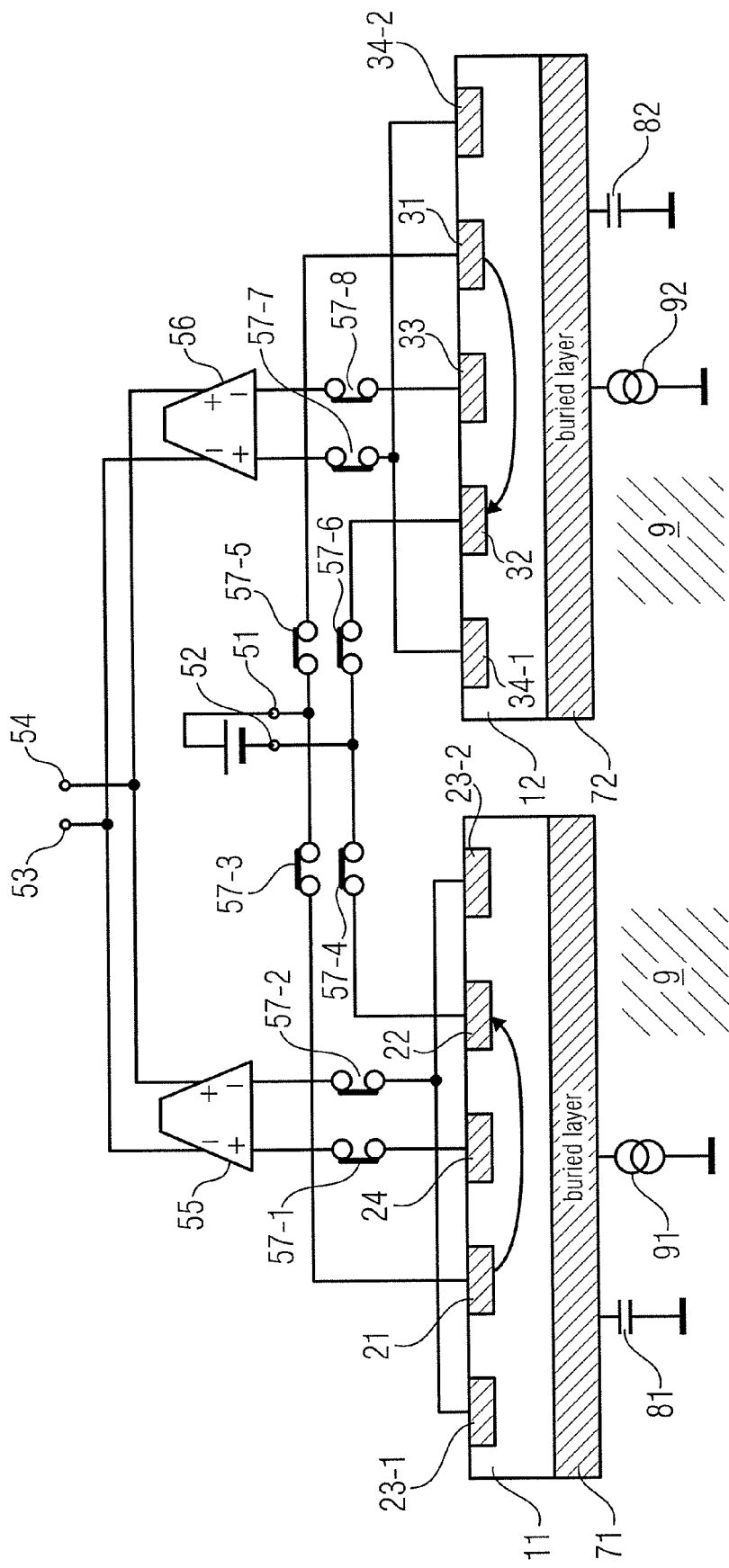
FIGS. 17A and 17B show schematic cross sections of a vertical Hall device according to embodiments having summing amps during a first spinning phase and a second spinning phase.
Figure 17B:
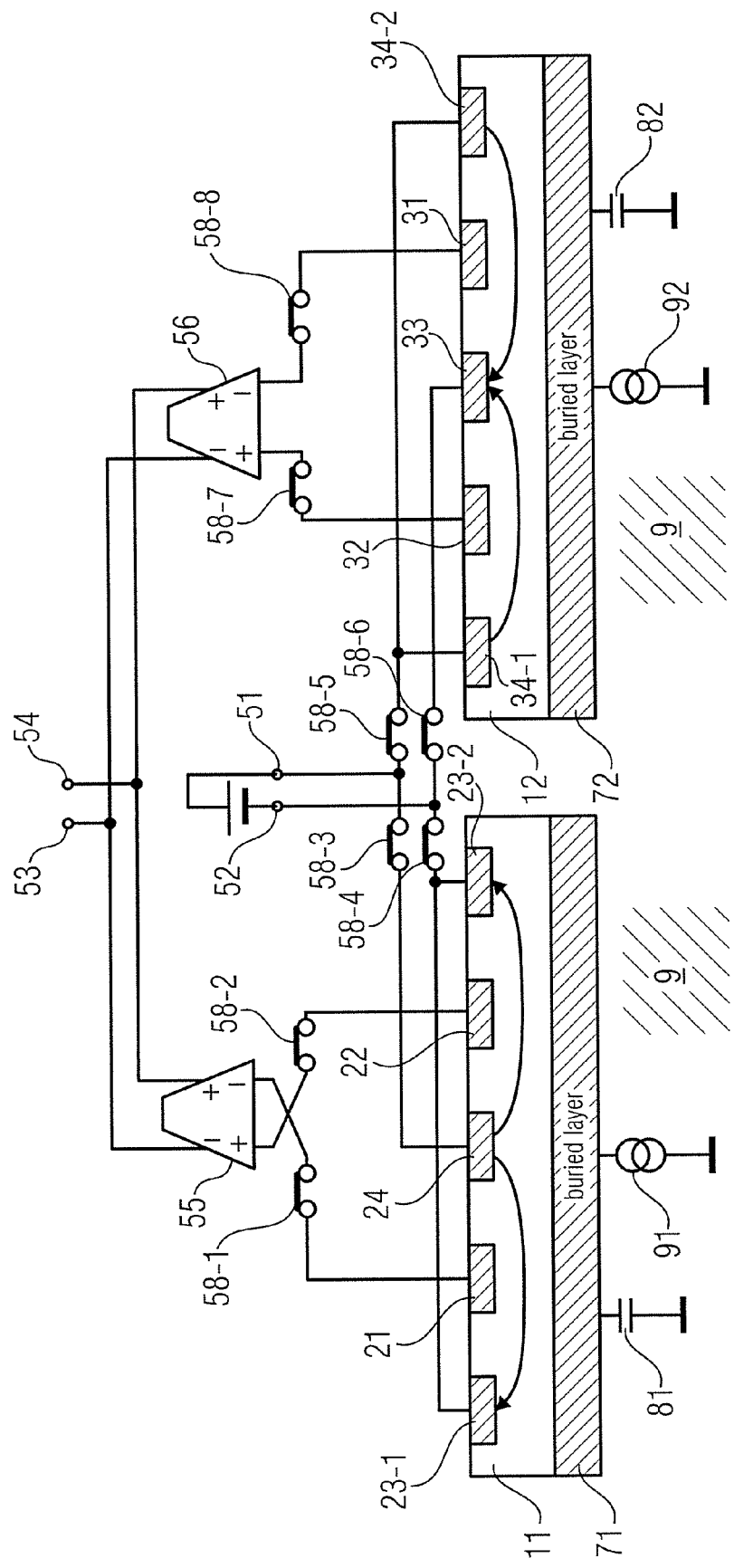

FIGS. 17A and 17B show schematic cross sections and internal interconnections of a vertical Hall device according to embodiments during a first spinning phase (FIG. 17A) and a second spinning phase (FIG. 17B). In addition to the embodiment(s) shown in FIGS. 16A and 16B the embodiment(s) shown in FIGS. 17A and 17B comprise summing amplifiers 55, 56 and switching elements 57-1 to 57-8 (depicted in FIG. 17A) and 58-1 to 58-8 (depicted in FIG. 17B). The summing amplifiers 55 and 56 are configured to sum the voltages at the various sense contacts. Thus, the sense contacts are not connected by a short circuit as in other embodiments (e.g., the embodiment(s) shown in FIGS. 16A and 16B). For example, in the embodiment(s) shown in FIGS. 16A and 16B the contact 24 of the first Hall effect region 11 is connected to the contacts 34-1, 34-2 of the second Hall effect region 12 by a short circuit or another low ohmic connection. In the embodiment(s) illustrated in FIGS. 17A, 17B each sense contact (e.g., contacts 24 and 33 during the first spinning phase and contacts 21, 22, 31, and 32 during the second spinning phase) or pair of sense contacts (e.g., contacts 23-1, 23-2 and 34-1, 34-2 during the first spinning phase) is connected to a relatively high ohmic input of one of the summing amplifiers 55, 56. Outputs of the summing amplifiers are connected to the terminals 53, 54 of the vertical Hall device. Each summing amplifier 55, 56 amplifies and inverts the amplifier input voltage between the inverting input ("−") and the non-inverting input ("+") of the corresponding summing amplifier 55, 56. In embodiments it is also possible that the summing amplifiers 55, 56 are transconductance amplifiers. The summing amplifiers 55, 56 are transparent to a connection between the contacts 21 to 24, 31 to 34 and the terminals 51 to 54 so that during a given spinning phase each sense terminal 53, 54 may be considered as being connected to the same number of outmost contacts 23-1, 23-2, 34-1, 34-2. During the first spinning phase each sense terminal 53, 54 is connected to two outmost contacts. During the second spinning phase each sense terminal 53, 54 is connected to none of the outmost contacts. With respect to the supply terminals 51, 52, each supply terminal is connected to none of the outmost contacts during the first spinning phase and to two outmost contacts during the second spinning phase.

The switching elements 57-1 to 57-8 and 58-1 to 58-8 are configured to selectively connect the contacts of the first and second Hall effect regions with the inputs of the summing amplifiers. For the sake of clarity only those switching elements are depicted in FIGS. 17A, 17B that are conducting during the respective spinning phase.

Figure 18:
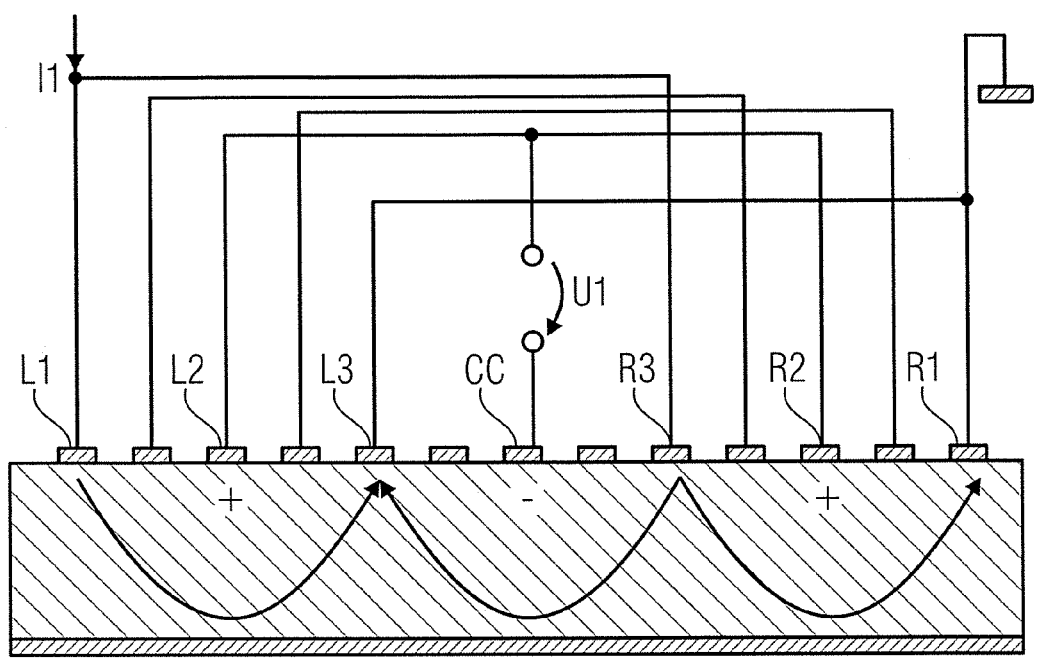
FIG. 18 shows a schematic cross-section of a vertical Hall device having 13 contacts, during a first operation phase.
Figure 19:
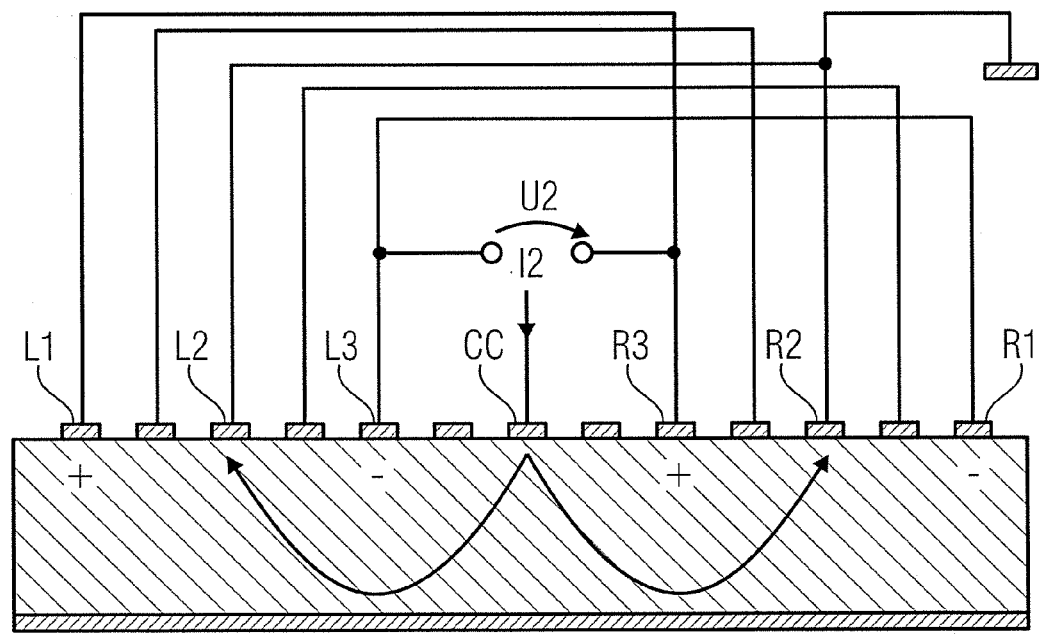
FIG. 19 shows a schematic cross-section of the vertical Hall device of FIG. 18, during a second operating phase.

FIGS. 18 and 19 show schematic cross-sections of a vertical Hall device during a first operating phase (FIG. 18) and a second operating phase (FIG. 19). The vertical Hall device shown in FIGS. 18 and 19 is a two-tub-and-13-contact device. Note that only one of the two tubs is shown. The electrical connection of the second, anti-parallel tub can be derived from the first tub. The electrical current flows mirror-symmetrically within the first and second tubs.

Note that the vertical Hall device has a perfectly symmetric geometry (neglecting manufacturing tolerances, of course), with respect to electrical properties. If a potential distribution establishes, as illustrated in FIG. 19 (=second operating phase), this potential distribution is also substantially perfectly symmetric. Yet the potential distribution that establishes when the vertical Hall device is connected as illustrated in FIG. 18 is not symmetric anymore (at least not symmetric to the center contact CC). Thus, due to the junction field effect, the conductive volume will be asymmetric.

In the first operating phase which is illustrated in FIG. 18, the electrical current I1 is supplied to the contact L1 and R3. Within the tub of the vertical Hall device the electrical current I1 divides up in three approximately equal current portions, two of which flow to the contact L3 and one portion flowing to the contact R1. The contacts L3 and R1 are connected to each other and also grounded so that the electrical current I1 leaves the tub via the contacts L3 and R1. The contacts L2 and R2 function as sense contacts during the first operating phase. Furthermore, the center contact CC also functions as a sense contact. Therefore, a sense signal U1 may be sensed between the contacts L2, R2 (which are electrically connected) and the center contact CC.

During the second operating phase illustrated in FIG. 19 an electrical current I2 is supplied via the center contact. Within the tub of the vertical Hall device the electrical current splits into two approximately equal portions. A first portion traverses the tub towards the left and leaves the same at the contact L2, while a second portion traverses the tub in an opposite direction and leaves the tub at the contact R2. In the second operating phase, the contacts L2 and R2 are connected to each other and also grounded. The sense signal U2 for the second operating phase is obtained between the contacts L3 and R1 on the one hand and the contacts L1 and R3 on the other hand.

Figure 20:
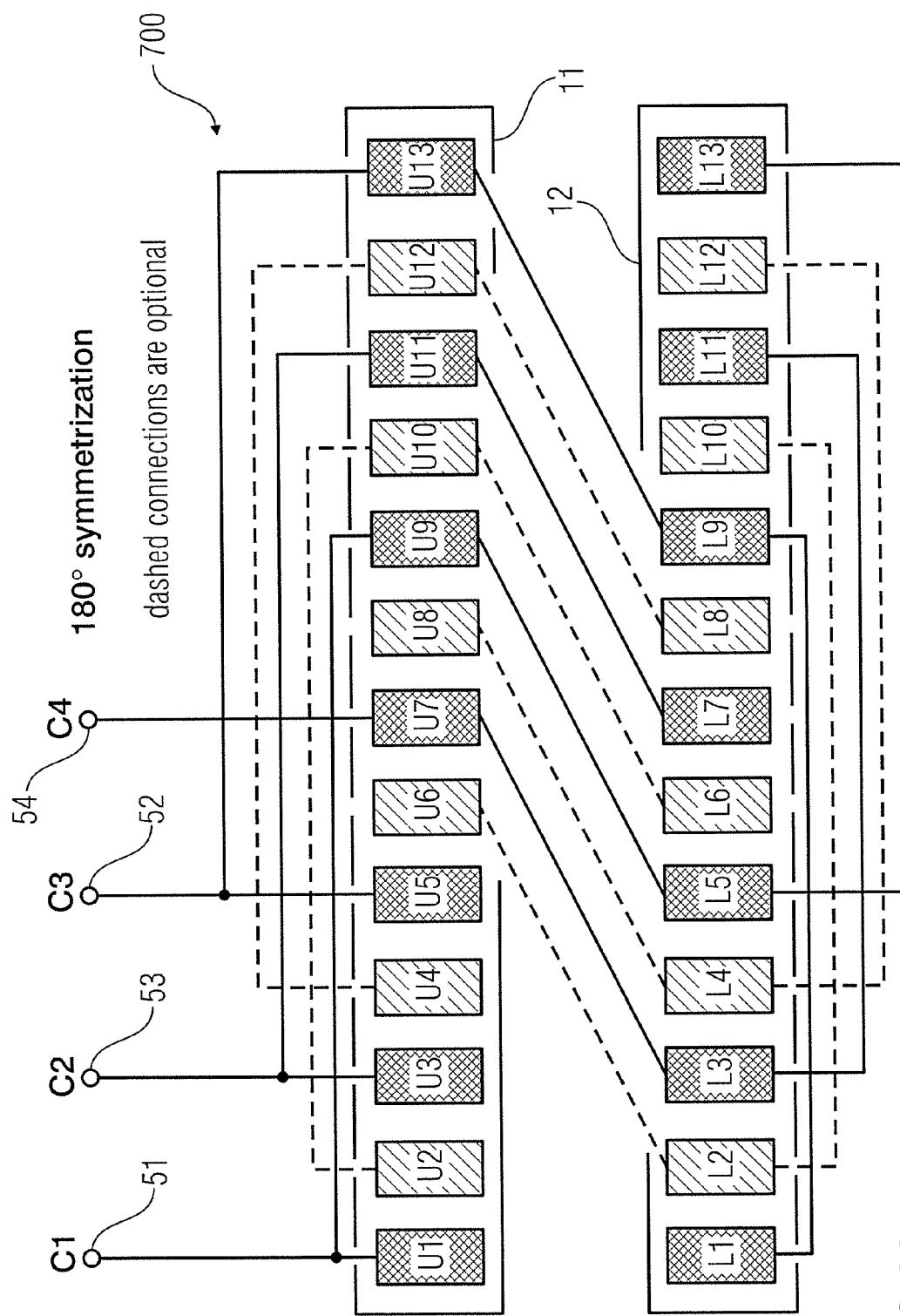
FIG. 20 shows a schematic top view of a vertical Hall device according to further embodiments obtained by combining two vertical Hall devices according to FIGS. 16 and 17.

FIG. 20 shows a schematic top view of a vertical Hall device 700 according to embodiments. The vertical Hall device 700 is obtained by wiring together the vertical Hall devices shown in FIGS. 18 and 19 according to embodiment so that the current flows in opposite directions in both tubs (valid for both operating phases). This establishes a high degree of overall symmetry in both operating phases.

A first group of contacts U1 to U13 is arranged in or at a surface of a first tub 11. A second group of contacts L1 to L13 is arranged in or at a surface of a second tub 12. The even numbered contacts U2, U4, U6, . . . and L2, L4, . . . are optional. Moreover, the connections between the even numbered contacts are optional as well which means that the even numbered contacts U2, U4, . . . may be present but not the connections between them (for example, the connection between the contacts U2 and U10), in which case the even numbered contacts U2, U4, . . . and L2, L4, . . . are, for example, floating contacts.

The vertical Hall device 700 shown in FIG. 20 also fulfills the condition for the current streamlines according to which the current streamlines in the first tub 11 are substantially equal to the current streamlines in the second tub 12 but with opposite directions. For example, when an electrical current is supplied to a terminal C1 and withdrawn at the terminal C3, at least a portion of the electrical current traverses the first starting at the contact U9 and ending at the contact U5. In the second tub 12 a portion of the electrical current enters the second tub 12 at the contact L5 which is vertically aligned with the contact U5 of the first tub 11. The current portion traverses the second tub 12 substantially from left to right until it leaves the second tub 12 at the contact L9 which is electrically connected to the contacts U13 and U5 of the first tub 11. Furthermore, the contact L9 is vertically aligned to the contact U9 of the first tub 11. As mentioned above, another criterion for a correspondence of contacts in the first tub 11 and the second tub 12 may be used instead of the vertical alignment in a column arrangement.

It should be noted that the similarity of the current streamlines in corresponding portions of the first and second tubs is typically valid only for a vanishing magnetic field parallel to the substrate surface and perpendicular to the main direction of current flow. With an increasing magnetic field in the mentioned direction (referred to as the z-direction at various places throughout this document) the current streamlines will be increasingly different. This difference of the current streamline in the first tub and the second tub with increasing magnitude of the magnetic field in the z-direction is reflected in a different distribution of the electrical potential at the surface of the tubs. In turn, this difference of the electrical potential distribution can be evaluated by means of the sense signal. Therefore, the feature according to which current streamlines in the first tub 11 are substantially the same as in the second tub 12 in both operating phases, yet with opposite direction of current flow, may be exactly valid for a particular magnetic field strength only, typically a vanishing magnetic field strength (0 T).

Figure 21:
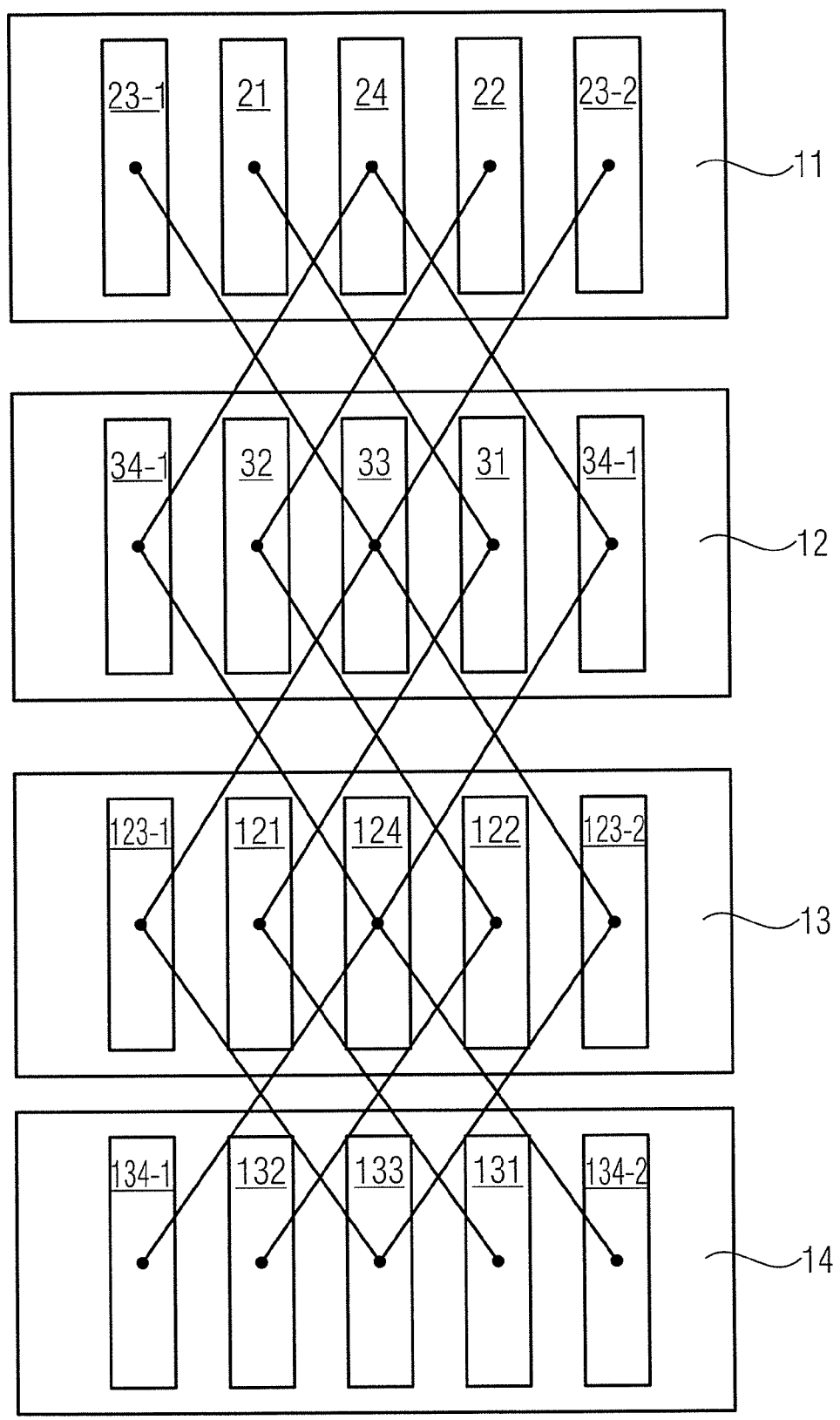
FIG. 21 shows a schematic top view of a vertical Hall device with multiple pairs of Hall effect regions.

FIG. 21 shows a schematic top view of a vertical Hall device having multiple pairs of Hall effect regions. The vertical Hall device comprises four Hall effect regions 11, 12, 13, and 14. The vertical Hall device further comprises four groups of contacts. A first group of contacts 23-1, 21, 24, 22, 23-2 is arranged at a surface of the first Hall effect region 11. A second group of contacts 34-1, 32, 33, 31, 34-2 is arranged at a surface of the first Hall effect region 12. A third group of contacts 123-1, 121, 124, 122, 123-2 is arranged at a surface of the third Hall effect region 13. A second group of contacts 134-1, 132, 133, 131, 134-2 is arranged at a surface of the first Hall effect region 14. The first Hall effect region 11 and the second Hall effect region form a pair of Hall effect regions. Likewise, the third Hall effect region 13 and the fourth Hall effect region 14 form another pair of Hall effect regions. The two pairs are connected and substantially identical. The schema illustrated in FIG. 21 can be extended to more than two pairs, i.e. multiple pairs.

Figure 22:
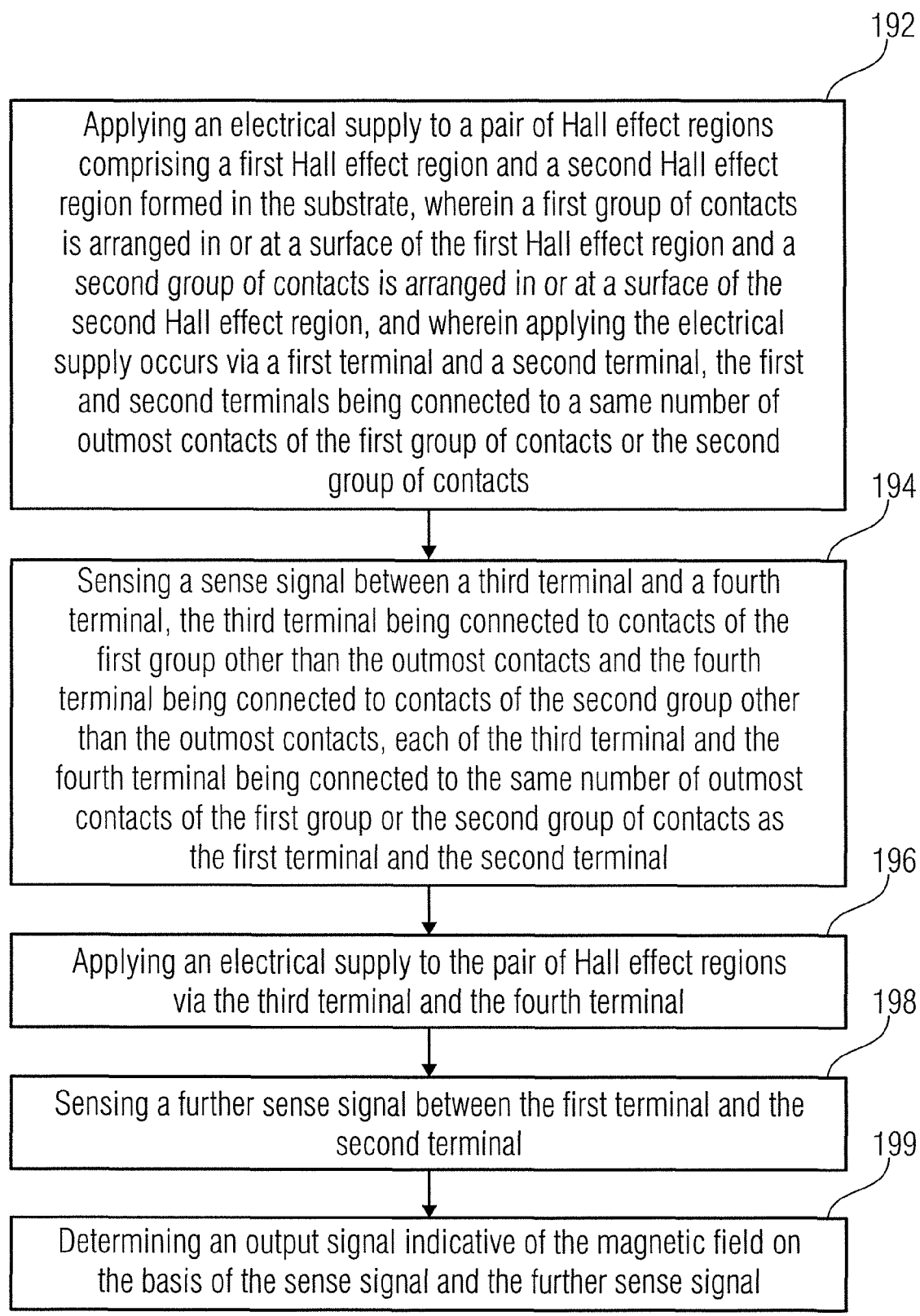
FIG. 22 shows a schematic flow diagram of a sensing method according to a embodiments.
Figure 23:
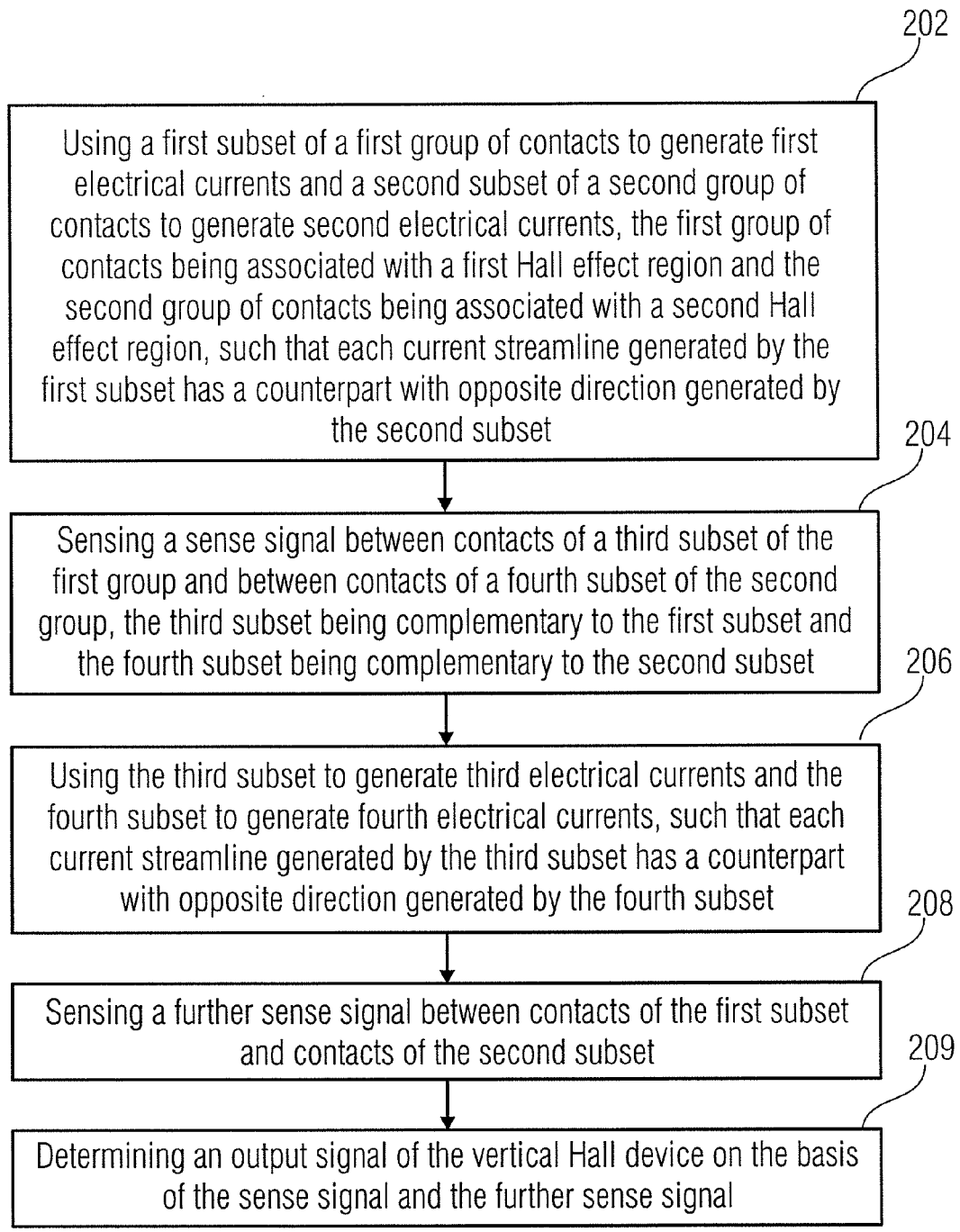
FIG. 23 shows a schematic flow diagram of a sensing method according to other embodiments.

FIG. 22 shows a schematic flow diagram of a sensing method according to embodiments. During a step 192 an electric current is fed to a first supply terminal of a vertical Hall device and withdrawn at a second supply terminal from the vertical Hall device. The first supply terminal is connected to an outmost contact of a first group of contacts arranged in or at a surface of a first Hall effect region formed in a substrate. The first supply terminal is also connected to an inner contact of a second group of contacts arranged in or at a surface of a second Hall effect region formed in the substrate. According to step 194 a sense signal is then sensed between a first sense terminal and a second sense terminal. The first sense terminal is connected to an inner contact of the first group and also to an outmost contact of the second group. The electric current or a further electric current is then fed to the vertical Hall device via the first sense terminal, as indicated at 196 of the sensing method. The electric current or the further electric current is withdrawn from the vertical Hall device via the second sense terminal. A further sense signal is sensed in a step 198 between the (former) first and second supply contacts. During a step 199 an output signal of the vertical Hall device is determined on the basis of the sense signal and the further sense signal.

It is to be noted that in the above described embodiments, all contacts of the vertical Hall device that are used for generating a signal indicative of the magnetic field, i.e. all contacts which are used in the spinning phases interchanged to generate electrical currents or to sense the Hall effect are associated with one of the above described two Hall effect regions, i.e. with the above described tubs 11, 12. In other words, each contact of the vertical Hall device that is used in the spinning phases interchanged to generate electrical currents or to sense the Hall effect is one of the first group of contacts of second group of contacts.

While the above described embodiments use one pair of Hall effect regions, other embodiments may use multiple pairs of Hall effect regions. The multiple pairs of Hall effect regions may be connected to common terminals. In embodiments of multiple pairs, for each spinning phase, each pair of Hall effect regions from the multiple pairs has one Hall effect region inter-connected to the other Hall effect region of this pair such that current flows have reversed directions. In embodiments of multiple pairs, there may be however one Hall effect region for each pair which has a same current distribution and same direction of current flow than another Hall effect region of another pair.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The invention claimed is:

1. A sensor, comprising:
   a vertical Hall device formed in a substrate, configured to sense a magnetic field that is parallel to a horizontal surface of the substrate, the vertical Hall device comprising:
   first, second, third and fourth terminals;
   contacts to generate a Hall effect signal indicative of the magnetic field;
   at least one pair of Hall effect regions, the at least one pair of Hall effect regions comprising a first Hall effect region and a second Hall effect region formed in the horizontal substrate, wherein the first Hall effect region is separate from and distinct from the second Hall effect region, and wherein the first Hall effect region and the second Hall effect region are electrically isolated from each other by means of at least one of a reverse biased on-junction, and a trench coated with a dielectric layer;
   a first group of the contacts being arranged in or at a surface of the first Hall effect region, the first group comprising a first and second outmost contacts; and
   a second group of contacts arranged in or at a surface of the second Hall effect region, the second group comprising third and fourth outmost contacts;
   wherein each of the first, second, third and fourth terminals is connected to exactly only one of the outmost contacts, and wherein each of the first, second, third and fourth terminals is connected to a different one of the outmost contacts.

2. The vertical Hall device according to claim 1, wherein all contacts utilized in the vertical Hall device to generate a Hall effect signal are arranged in or at a surface of the first and second Hall effect region of at least one pair of Hall effect regions.

3. The vertical Hall device according to claim 1, wherein the first group comprises at least one inner contact and the second group comprises at least one inner contact, wherein the inner contact of the first group is connected to one of the outmost contacts of the second group, and wherein the inner contact of the second group is connected to one of the outmost contacts of the first group.

4. The vertical Hall device according to claim 1, wherein two terminals of the first, second, third, and fourth terminals are effective as a pair of supply terminals, and wherein the two other terminals of the first, second, third, and fourth terminals are effective as a pair of sense terminals.

5. The vertical Hall device according to claim 1, further comprising a further contact that does not belong to the first group or the second group, the further contact being arranged between one of the outmost contacts and an end of a corresponding Hall effect region which is nearest to said one of the outmost contacts.

6. The vertical Hall device according to claim 1, wherein the first group and the second group each comprises an even number of contacts.

7. The vertical Hall device according to claim 1, wherein the first group comprises $4*n+2$ contacts, with $n=1, 2, 3, \ldots$, and wherein the second group comprises $4*m+2$ contacts, with $m=1, 2, 3, \ldots$.

8. The vertical Hall device according to claim 1, wherein the first Hall effect region and the second Hall effect region are arranged with respect to each other according to one of the following arrangements:

aligned arrangement in which a longitudinal axis of the first Hall effect region and a longitudinal axis of the second Hall effect region are aligned;

parallel arrangement in which the longitudinal axes of the first and second Hall effect regions are parallel and offset to each other;

column arrangement in which the second Hall effect region is offset to the first Hall effect region in a direction orthogonal to the longitudinal axes of the first and second Hall effect regions; and angled arrangement.

9. The vertical Hall device according to claim 1, wherein a current flow within the first Hall effect region is opposite to a current flow within the second Hall effect region in corresponding regions of the first and second Hall effect regions.

10. The vertical Hall device according to claim 1, wherein at least one of the outmost contacts is used, at least temporarily, as a sense contact.

11. A vertical Hall device indicative of a magnetic field parallel to the surface of a substrate, the vertical Hall device comprising:

at least one pair of Hall effect regions, the at least one pair of Hall effect regions comprising:

a first Hall effect region and a second Hall effect region;

a first group of contacts associated with the first Hall effect region;

a second group of contacts associated with the second Hall effect region;

wherein the vertical Hall device is configured to utilize during a first spinning phase a first subset of contacts from the first group of contacts as supply contacts for the first Hall effect region and a second subset of contacts from the second group of contacts as supply contacts for the second Hall effect region, the number of contacts in the first subset of contacts being equal to the number of contacts in the second subset of contacts, wherein at least one of the contacts of the first subset and at least one of the contacts of the second subset are coupled to provide a same upper potential as a supply potential during the first spinning phase, and wherein at least one other of the contacts of the first subset and at least one other of the contacts of the second subset are coupled to provide a same lower potential as a further supply potential during the first spinning phase, wherein trajectories of current streamlines generated by the first subset of contacts in the first Hall effect region are opposite-identical to trajectories of current streamlines generated by the second subset of contacts in the second Hall effect region; and during a second spinning phase a third subset of contacts from the first group of contacts as supply contacts for the first Hall effect region, the third subset including contacts of the first group which are not contained in the first subset, and a fourth subset of contacts from the second group of contacts as supply contacts for the second Hall effect region, the contacts of the fourth subset of contacts including contacts of the second group of contacts which are not contained in the second subset, wherein trajectories of the current streamlines generated by the third subset of contacts in the first Hall effect region are opposite-identical to trajectories of the current streamlines generated by the fourth subset of contacts in the second Hall effect region.

12. The vertical Hall device according to claim 11, wherein at least one of the contacts of the third subset and at least one of the contacts of the fourth subset are coupled to provide a same upper potential as a supply potential during the second spinning phase, and wherein at least one other of the contacts of the third subset and at least one other of the contacts of the fourth subset are coupled to provide a same lower potential as a further supply potential during the second spinning phase.

13. The vertical Hall device according to claim 11, wherein all contacts used in the vertical Hall device to supply current streamlines during a spinning current operation are associated with one of the first or second group of contacts.

14. The vertical Hall device according to claim 11, wherein the first group of contacts and the second group of contacts each comprise an odd number of contacts, wherein the first subset and the second subset comprises another odd number of contacts, and wherein in the first and second subsets different numbers of contacts are at an upper potential.

15. The vertical Hall device according to claim 11, further comprising four terminals;

wherein the first group of contacts comprises first and second outmost contacts, wherein the second group of contacts comprises third and fourth outmost contacts, and wherein each of the four terminals is connected to exactly one or to a same number of the outmost contacts.

16. A vertical Hall device, the vertical Hall device comprising:

a first group of contacts associated with a first Hall effect region;

a second group of contacts associated with a second Hall effect region;

wherein during a first spinning phase, a first subset of the first group of contacts is used to generate first electrical currents and a second subset of the second group of contacts is used to generate second electrical currents, such that each current streamline generated by the first subset has a counterpart with opposite direction generated by the second subset, wherein at least one of the contacts of the first subset and at least one of the contacts of the second subset are coupled to provide a same upper potential as a supply potential during the first spinning phase, and wherein at least one other of the contacts of the first subset and at least one other of the contacts of the second subset are coupled to provide a same lower potential as a further supply potential during the first spinning phase; and during a second spinning phase, a third subset of the first group of contacts is used to generate third electrical currents and a fourth subset of the second group of contacts is used to generate fourth electrical currents, such that each current streamline generated by the third subset has a counterpart with opposite direction generated by the fourth subset, the third subset being complementary to the first subset and the fourth subset being complementary to the second subset.

17. The vertical Hall device according to claim 16, wherein contacts of the first group are directly connected to contacts of the second group.

18. The vertical Hall device according to claim 16, wherein each contact used in the vertical Hall device to supply or sense is a contact of the first or second group.

19. A vertical Hall device comprising:

a first Hall effect region;

a second Hall effect region;

first, second, third and fourth terminals;

a first sequence of n contacts associated with the first Hall effect region, the first sequence of contacts having contacts in an order from 1 to n, wherein n is an integer number greater or equal to 4;

a second sequence of n contacts associated with the second Hall effect region, the second sequence having an order of contacts from 1 to n;

wherein for integer m between 1 and n−2, the m-th contact of the first sequence of contacts is connected to the (m+2)th contact of the corresponding contact in the second sequence, and the (m+2)th contact of the first sequence is connected to the m-th contact of the second sequence;

wherein the first and the n-th contact of the first and second sequence respectively form an outmost contact, so that the first sequence comprises a first and second outmost contact, and the second sequence comprises a third and fourth outmost contact, and wherein each of the first, second, third and fourth terminals is connected to exactly only one of the outmost contacts, and wherein each of the first, second, third and fourth terminals is connected to a different one of the outmost contacts.

20. The vertical Hall device according to claim 19, wherein each contact used in the vertical Hall device to supply and sense is a contact within one of the first or second sequence.

21. The vertical Hall device according to claim 19, wherein trajectories of current streamlines are opposite identical in the first Hall effect region and the second Hall effect region.

22. The vertical Hall device according to claim 19, wherein the contacts of the first sequence and the contacts of the second sequence are coupled to provide the same upper potential and the same lower potential as supply potentials.

23. The vertical Hall device according to claim 19, wherein the first sequence of n contacts extends along a first direction and the second sequence of contacts extends along a second direction.

24. A vertical Hall sensor, the vertical Hall sensor comprising:

a first sequence of contacts associated with a first Hall effect region;

a second sequence of contacts associated with a second Hall effect region;

wherein the vertical Hall sensor is operable during a first spinning phase to induce one or more electrical currents in the first Hall effect region and the second Hall effect region, wherein at least one of the contacts of the first sequence and at least one of the contacts of the second sequence are coupled to provide a same upper potential as a supply potential during the first spinning phase, and wherein at least one other of the contacts of the first sequence and at least one other of the contacts of the second sequence are coupled to provide a same lower potential as a further supply potential during the first spinning phase, wherein for each current streamline in the first Hall effect region exists a corresponding current streamline in the second Hall effect region with reverse flow direction;

during a second spinning phase to induce one or more electrical currents in the first Hall effect region and the second Hall effect region, wherein for each current streamline in the first Hall effect region exists a corresponding current streamline in the second Hall effect region with reverse flow direction;

wherein contacts of the first sequences are swapped when generating the electrical currents in the first spinning phase and the second spinning phase and contacts of the second sequence are swapped when generating the electrical currents in the first spinning phase and the second spinning phase.

25. The vertical Hall device according to claim 24, wherein each contact used in the vertical Hall devices to supply or sense is a contact within one of the first or second sequence.

26. A sensing method for sensing a magnetic field parallel to a surface of a substrate, the method comprising:

applying an electrical supply to a pair of Hall effect regions comprising a first Hall effect region and a second Hall effect region formed in the substrate, wherein a first group of contacts is arranged in or at a surface of the first Hall effect region and a second group of contacts is arranged in or at a surface of the second Hall effect region, and wherein applying the electrical supply occurs via a first terminal and a second terminal, the first and second terminals being connected to a same number of outmost contacts of the first group of contacts or the second group of contacts, wherein at least one of the contacts of the first group and at least one of the contacts of the second group are coupled to provide a same upper potential as a supply potential during a first spinning phase, and wherein at least one other of the contacts of the first group and at least one other of the contacts of the second group are coupled to provide a same lower potential as further supply potential during the first spinning phase;

sensing a sense signal between a third terminal and a fourth terminal, the third terminal being connected to contacts of the first group other than the outmost contacts and the fourth terminal being connected to contacts of the second group other than the outmost contacts, each of the third terminal and the fourth terminal being connected to the same number of outmost contacts of the first group or the second group of contacts as the first terminal and the second terminal;

applying the electrical supply to the pair of Hall effect regions via the third terminal and the fourth terminal;

sensing a further sense signal between the first terminal and the second terminal; and determining an output signal indicative of the magnetic field on the basis of the sense signal and the further sense signal.

* * * * *

UNITED STATES PATENT AND TRADEMARK OFFICE
CERTIFICATE OF CORRECTION

| | | |
|---|---|---|
| PATENT NO. | : 9,312,472 B2 | Page 1 of 1 |
| APPLICATION NO. | : 13/400214 | |
| DATED | : April 12, 2016 | |
| INVENTOR(S) | : Udo Ausserlechner et al. | |

It is certified that error appears in the above-identified patent and that said Letters Patent is hereby corrected as shown below:

In the Claims

Column 24, Claim 1, Line 22 Please replace "...on-junction, and..."

with --...pn-junction, and ...--

Signed and Sealed this
Seventh Day of June, 2016

Michelle K. Lee
*Director of the United States Patent and Trademark Office*